(12) United States Patent
Oh et al.

(10) Patent No.: US 10,671,464 B2
(45) Date of Patent: Jun. 2, 2020

(54) MEMORY DEVICE COMPRISING STATUS CIRCUIT AND OPERATING METHOD THEREOF

(71) Applicant: SAMSUNG ELECTRONICS CO., LTD., Suwon-si, Gyeonggi-Do (KR)

(72) Inventors: Moonhee Oh, Osan-si (KR); Je Min Ryu, Seoul (KR); Reum Oh, Hwaseong-si (KR); Jaeyoun Youn, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 147 days.

(21) Appl. No.: 15/850,604

(22) Filed: Dec. 21, 2017

(65) Prior Publication Data

US 2018/0189127 A1    Jul. 5, 2018

(30) Foreign Application Priority Data

Dec. 29, 2016 (KR) ................. 10-2016-0182659

(51) Int. Cl.
| G06F 11/00 | (2006.01) |
| G06F 11/07 | (2006.01) |
| G06F 12/0802 | (2016.01) |
| G11C 16/10 | (2006.01) |
| G06F 11/10 | (2006.01) |
| G11C 29/48 | (2006.01) |
| G11C 29/04 | (2006.01) |

(52) U.S. Cl.
CPC ...... *G06F 11/0721* (2013.01); *G06F 11/0736* (2013.01); *G06F 11/1048* (2013.01); *G06F 12/0802* (2013.01); *G11C 16/10* (2013.01); *G11C 29/48* (2013.01); *G11C 2029/0409* (2013.01)

(58) Field of Classification Search
CPC ............. G06F 11/0721; G06F 11/0736; G06F 12/0802; G11C 16/10; G11C 29/48
See application file for complete search history.

(56) References Cited

U.S. PATENT DOCUMENTS

| 6,026,014 A * | 2/2000 | Sato .................... G11C 11/5621 365/185.03 |
| 6,675,335 B1 | 1/2004 | Chiang et al. |
| 7,315,481 B2 * | 1/2008 | Ito ........................... G11C 7/14 365/189.09 |
| 7,920,431 B2 * | 4/2011 | Nobunaga ........... G06F 13/1694 365/189.14 |
| 8,055,960 B2 | 11/2011 | Huott et al. |
| 8,537,624 B2 * | 9/2013 | Bae ......................... G11C 7/22 365/189.05 |

(Continued)

FOREIGN PATENT DOCUMENTS

| KR | 10-2014-0050975 | 4/2014 |
| KR | 10-2015-0003026 | 1/2015 |
| KR | 10-1658828 | 9/2016 |

*Primary Examiner* — Esaw T Abraham
(74) *Attorney, Agent, or Firm* — F. Chau & Associates, LLC

(57) ABSTRACT

A memory device includes a command decoder and a status circuit. The command decoder decodes a command. The status circuit sequentially stores operation information of the memory device determined based on the decoded command and outputs at least one of the sequentially stored operation information in response to an output control signal.

19 Claims, 17 Drawing Sheets

(56) References Cited

U.S. PATENT DOCUMENTS

| | | | |
|---|---|---|---|
| 8,595,557 B2 | 11/2013 | Jasinski et al. | |
| 8,788,756 B2 * | 7/2014 | Kulkarni | G06F 13/4291 |
| | | | 711/114 |
| 8,935,461 B2 * | 1/2015 | Nishikawa | G11C 11/5628 |
| | | | 711/103 |
| 9,042,199 B2 * | 5/2015 | Gillingham | G06F 13/1694 |
| | | | 365/233.1 |
| 9,190,153 B2 * | 11/2015 | Nobunaga | G06F 13/1694 |
| 9,384,847 B2 * | 7/2016 | Gillingham | G06F 13/1694 |
| 9,664,228 B2 * | 5/2017 | Auer | B29C 70/30 |
| 9,852,090 B2 * | 12/2017 | Hill | G06F 13/22 |
| 9,891,887 B2 * | 2/2018 | Elmer | G06F 7/49957 |
| 2007/0047347 A1 | 3/2007 | Byun et al. | |
| 2009/0044044 A1 | 2/2009 | Harter et al. | |
| 2016/0246514 A1 * | 8/2016 | Nosaka | G06F 3/0611 |
| 2016/0283315 A1 | 9/2016 | Kwon | |

* cited by examiner

MEMORY DEVICE COMPRISING STATUS CIRCUIT AND OPERATING METHOD THEREOF

CROSS-REFERENCE TO RELATED APPLICATIONS

This application claims the benefit of priority under 35 U.S.C. § 119 from Korean Patent Application No. 10-2.016-0182659 filed Dec. 29, 2016, in the Korean Intellectual Property Office, the entire contents of which are incorporated by reference herein.

Technical Field

Embodiments of the inventive concept disclosed herein relate to a semiconductor memory device, and more particularly, to a memory device including a status circuit and an operating method thereof.

Discussion of the Related Art

In a process of manufacturing a memory cell, an error may occur in the memory cell due to a nanofabrication process. The error may be roughly classified as a hard error or a soft error. The hard error may refer to a case where a memory cell hardware is damaged. The soft error may refer to a case where a memory cell hardware is not damaged, but data of the memory cell temporarily transitions due to alpha particles and so on. The hard error may be corrected through the spare memory cell SMC or an error correction operation. The soft error may be corrected through an error correction operation.

In addition to errors occurring from the manufacture of memory cells, operation error or failure of the memory device may occur due to decreases in supply voltage. As memory cell characteristics deteriorate due to nanofabrication processes or supply voltage decreases or variations, a volatile memory device such as a dynamic random access memory (DRAM) may require excessive refresh operations to retain data stored therein. To cope with a high-performance trend, also, memory devices are made to perform, for example, a write, operation, a read operation, etc. at higher speeds.

In the above-described case of a refresh, read, and write operations being performed, a voltage may not be smoothly supplied within the memory device because current consumption temporarily increases. Accordingly, issues may occur in the memory device such as a decrease in the timing margin and instability of a supply voltage. As a result, an operation failure of the memory device may occur.

SUMMARY

Embodiments of the inventive concept provide a memory device including a status circuit that stores operational information when an operation failure of the memory device occurs and an operating method thereof.

According to an aspect of an embodiment of the inventive concept, a memory device includes a command decoder and a status circuit. The command decoder decodes a command. The status circuit sequentially stores operation information of the memory device determined based on the decoded command and outputs at least one of the sequentially stored operation information in response to an output control signal. The status circuit may be configured to update operation information and store the updated operation information in response to an update control signal being received from the command decoder.

According to an embodiment of the inventive concept, an operating method of a memory device includes sequentially storing, at a status circuit included in the memory device, operational information of the memory device determined based on a command, receiving, at the status circuit, an output control signal, and providing, at the status circuit, the plurality of operational information, which are sequentially stored, to a host in response to the output control signal.

According to an embodiment of the inventive concept, an operating method of a memory device includes detecting, at a host, an operational failure of the memory device and generating an update control signal, storing, at a status circuit included in the memory device, operational information of the memory device, which is determined based on a command from the host, in response to the update control signal, and providing, at the status circuit, the stored operational information to the host in response to an output control signal from the host.

According to an embodiment of the inventive concept, a memory device includes: a logic circuit disposed on a substrate; at least first and second memory circuits vertically stacked on the logic circuit, the first and second memory circuits having a respective first input/output (i/o) interface and a second i/o interface; a status circuit configured to communicate with the first and second memory circuits via the first i/o interface and the second i/o interface, respectively, and the status circuit is configured to communicate with a host; wherein the status circuit receives and stores operation status information from each of the at least first and second memory circuits in response to an update control signal being received, and wherein the status circuit provides the stored operation status information of the at least first and second memory circuits in response to a single output control signal being received.

The status circuit may periodically update the stored operation status information of the at least first and second memory circuits in response to an update control signal being provided from the host.

The at least first and second memory circuits are connected to each other by through silicon vias (TSVs).

The status circuit may be additionally configured to communicate with the at least first and second memory circuit using the TSVs.

The logic circuit may include the status circuit.

The status circuit is configured to receive and store operation status information from the at least first and second memory devices through the first and second interfaces and the TSVs.

The status circuit may receives the output control signal from the host when the host compares output data of the at least first and second memory circuits of the memory device with expected data and detects an operation failure of the memory device.

The status circuit may receive the update control signal from the host when the host detects the operation failure of the memory device.

In response to the output control signal being received by the status circuit, the stored operation status information provided to the host may include status information periodically provided to the status circuit prior to the operation failure of the memory device detected by the host.

A plurality of solder balls may be connected to a substrate, and the status circuit provides the stored operation status information to the host through at least a portion of the plurality of solder balls.

The operation status information includes at least one of a command, an address, and input/output data that correspond to an operation of each of the at least first and second memory devices.

At least one operation information output by the status circuit comprises operation status information provided at random time intervals, or periodically provided to the status circuit prior to the operation failure of the memory device.

According to an embodiment of the inventive concept, a memory device includes: a substrate; an interposer disposed on the substrate; one or more processors arranged on the interposer; a memory circuit arranged on the interposer; and a status circuit connected to the memory circuit that is controlled by the one or more processors, the status circuit is configured to store operation status information. In response to a command sent from the one or more processors, the status circuit provides operation status of the memory circuit that includes information prior to the one or more processors detecting an operation failure of the memory circuit.

In response to an update control signal received by the status circuit, the operation status of the memory circuit is updated and stored.

The memory circuit may include a plurality of vertically stacked memory circuits having respective input/output (i/o) interfaces, and the operation status of the plurality of vertically stacked memory circuits may be provided by the status circuit to the one or more processors in response to a single output control signal.

The memory circuit may communicate with the one or more processors through the interposer.

The plurality of vertically stacked memory circuits are connected to each other by through silicon vias (TSVs).

BRIEF DESCRIPTION OF THE DRAWINGS

The inventive concept will become better appreciated by a person of ordinary skill in the art from the following description with reference to the following figures, wherein like reference numerals refer to like parts throughout the various figures unless otherwise specified, and wherein.

DETAILED DESCRIPTION

Embodiments of the inventive concept may be described in detail to permit a person of ordinary skill in the art to implement the inventive concept.

Figure 1:
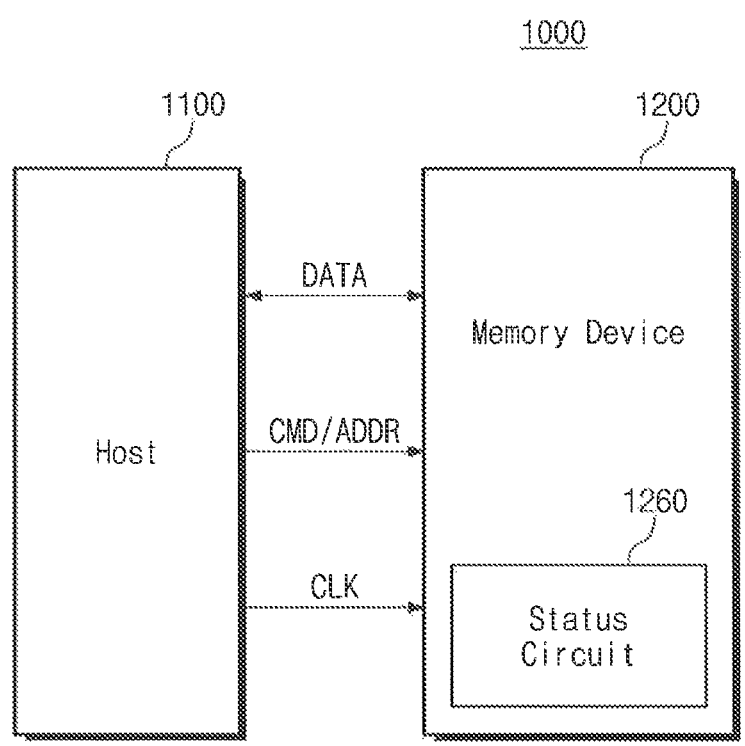
FIG. 1 is a block diagram illustrating a memory system according to an embodiment of the inventive concept.

FIG. 1 is a block diagram illustrating a memory system according to an embodiment of the inventive concept. Referring to FIG. 1, a memory system 1000 may include a host 1100 and a memory device 1200. For example, the memory system 1000 may be a single system that includes both the host 1100 and the memory device 1200. Alternatively, the host 1100 and the memory device 1200 of the memory system 1000 may be implemented with separate devices, respectively.

The host 1100 may be a processor circuit or system that includes a general-purpose processor or an application processor. Alternatively, the host 1100 may be one the following computing devices including one or more processors: a personal computer, a peripheral device, a digital camera, personal digital assistant (PDA), a portable media player (PMP), a smartphone, a tablet computer, or a wearable device, just to name some non-limiting possibilities. The processors include integrated circuits operable in hardware or in conjunction with software.

The memory device 1200 may store data provided from the host 1100 or data to be provided to the host 1100. The memory device 1200 may be implemented with storage media of any known type, each of which includes a volatile memory or a nonvolatile memory. For example, in the case where the memory device 1200 comprises a volatile memory, the memory device 1200 may include, for example, a dynamic random access memory (DRAM), a static RAM (SRAM), a thyristor RAM (TRAM), a zero capacitor RAM (Z-RAM), a twin transistor RAM (TTRAM), a magnetoresistive RAM (MRAM), etc. For example, in the case where the memory device 1200 includes a volatile memory, the memory device 1200 may include an unbuffered dual in-line memory module (UDIMM), a registered DIMM (RDIMM), a load reduced DIMM (LRDIMM), Non Volatile DIMM (NVDIMM), a high bandwidth memory (HBM), etc.

For example, in the case where the memory device 1200 comprises a nonvolatile memory, the memory device 1200 may be embodied as an electrically erasable programmable read-only memory (EEPROM), a flash memory, an MRAM, a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronics memory device, or an insulator resistance change memory. One or more bits may be stored in a unit cell of the nonvolatile memory. The above-described examples do not limit the scope of the inventive concept.

Below, for ease of description, it is assumed that the memory device 1200 includes a single memory device. However, as described above, a person of ordinary skill in the art should understand that the embodiments may be applied to various types storage devices in addition to those mentioned herein above.

The memory device 1200 may communicate with the host 1100 through an interface utilizing a communication protocol. For example, the memory device 1200 may communicate with the host 1100 based on one or more of various wired communication protocols, such as a universal serial bus (USB), a small computer system interface (SCSI), PCIe, a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). A person of ordinary skill in the art should understand and appreciate that the above-described examples do not limit the scope of the inventive concept.

The memory device 1200 may perform, for example, a write operation and/or a read operation in response to a command/address CMD/ADDR from the host 1100. The read operation and the write operation of the memory device 1200 are explained as follows.

For example, in the case of the read operation, the host 1100 provides an active command and a row address to the memory device 1200. After a reference time, the host 1100 provides a column address to the memory device 1200. Next, the memory device 1200 provides requested data DATA to the host 1100 after a specific time.

For example, in the case of the write operation, the host 1100 provides an active command and a row address to the memory device 1200. After a reference time, the host 1100 provides a write command and a column address to the memory device 1200. Afterwards, the host 1100 provides the memory device 1200 with data to be written. The memory device 1200 writes the received data in a memory area that is defined by the column and row addresses.

An operation failure occurs in the case where the memory device 1200 fails to perform an operation normally may occur during the above-described read or write operation. The operation failure may occur because of various reasons. For example, in the case where the memory device 1200 continuously performs the refresh operation, the read operation, the write operation, etc., an internal supply voltage of the memory device 1200 may become unstable because a current is being excessively used by a large quantity of operations.

In the case where a core voltage is not being supplied normally to a memory cell array (not illustrated) due to instability of the internal supply voltage, a memory cell of the memory cell array may not be selected or activated normally during the read operation or the write operation. Moreover, a supply voltage of a peripheral circuit that controls an operation of the memory device 1200 may become unstable for the same reasons discussed hereinabove. In such a case, a transmission timing of signals transmitted in the memory device 1200 may change. The changed transmission timing may be one reason that a timing margin of the signals is insufficient.

Alternatively, voltages provided by a voltage generator may become unstable for a number of reasons in addition to the reasons discussed herein above.

For example, a level of a reference voltage, which is provided by the voltage generator to a data input driver (not illustrated) of the memory device 1200, may become unstable. In this case, the data input driver may fail to determine a logical level of data DATA provided from the host 1100 normally. The inability of the data driver to determine a logical level of data can result in a retry of the operation, which will slow the performance of the memory device. On the other hand, the operation being executed may have a catastrophic failure if the data driver is not able to determine the logical level of data even for a relatively brief period of time. Thus, the memory device 1200 may fail to perform the read operation, the write operation, etc. normally due to such above-described causes such as an unstable supply voltage, insufficient timing margin, and an unstable reference voltage.

According to an embodiment of the inventive concept, the memory device 1200 may include a status circuit 1260. The status circuit permits a more exact determination as to the cause of the failure. In the case where the above-described operation failure occurs, the status circuit 1260 stores operation status information associated with the operation failure. Also, the status circuit 1260 may output the stored operation status information to the host 1100. For example, the status circuit 1260 may operate in response to a control signal received or generated during a test operation. For example, the control signal may be provided from the host 1100, or the control signal may be generated as a result of sensing an internal signal of the memory device 1200.

A configuration of the memory device 1200 that includes the status circuit 1260 storing the operation status information when the operation failure of the memory device 1200 occurs is briefly described above. Through the above-described configuration, in the case where the operation failure of the memory device 1200 occurs, the memory device 1200 may provide the operation status information to the host 1100 or a user. The inclusion of the status circuit in the configuration of the memory may make analysis of the operation failure of the memory device 1200 easier, and may reduce the time utilized to test the memory device 1200 when a failure occurs.

Figure 2:
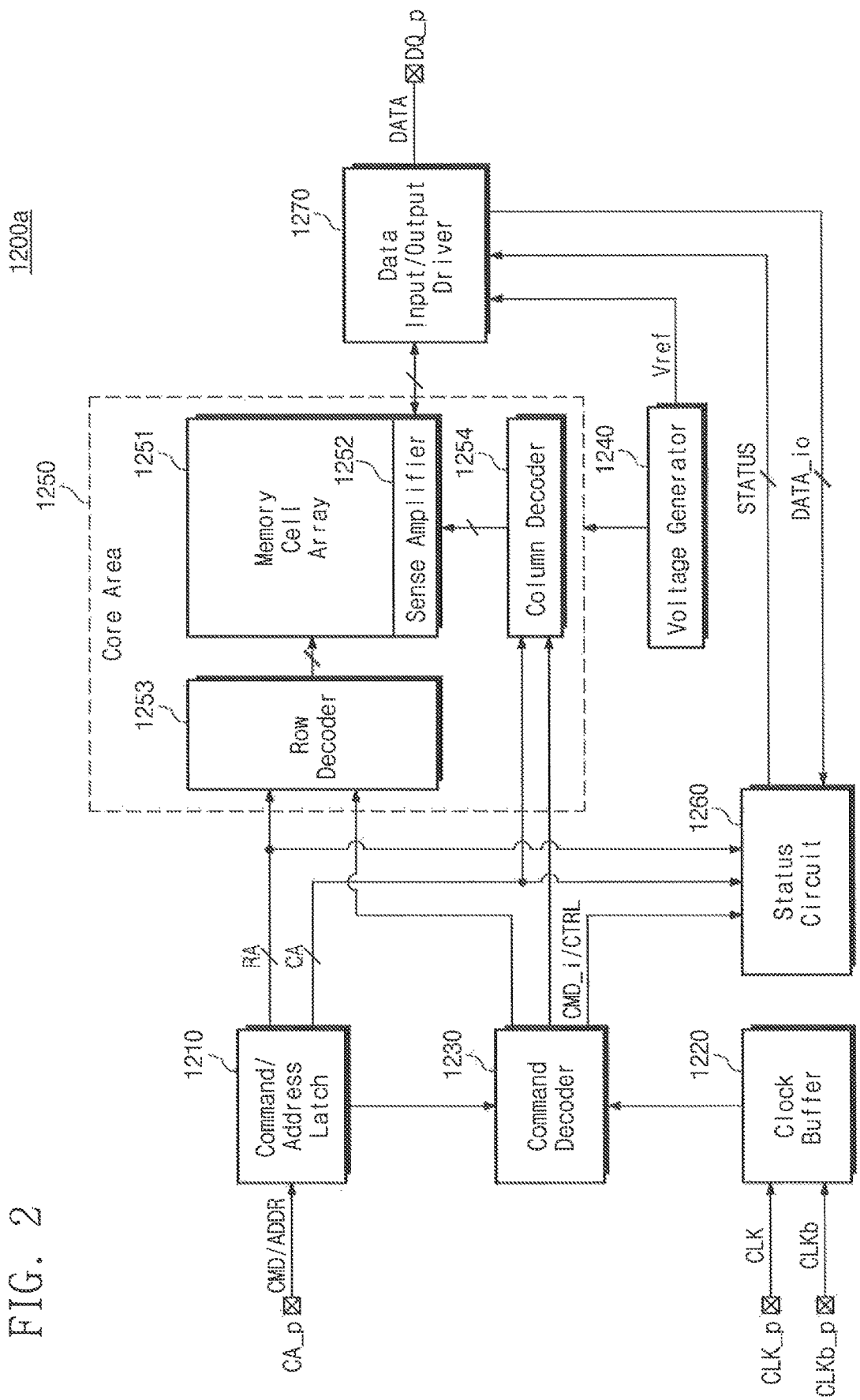
FIG. 2 is a block diagram illustrating a memory device shown in FIG. 1.

FIG. 2 is a block diagram providing more detail with regard to the memory device illustrated in FIG. 1. The block diagram of FIG. 2 will be described with reference to FIG. 1. Referring to FIG. 2, a memory device 1200a may include, for example, a command/address latch 1210, a clock buffer 1220, a command decoder 1230, a voltage generator 1240, a core area 1250, the status circuit 1260 referred to herein above, and a data input/output driver 1270.

The command/address latch 1210 may receive a command CMD and an address ADDR from the host 1100. The command/address latch 1210 provides the received command to the command decoder 1230. Also, the command/address latch 1210 provides the received address of a memory cell to a row decoder 1253 and a column decoder 1254. The address of the memory cell may include a row address RA and a column address CA.

The clock buffer 1220 is provided with an input of a clock signal CLK and a clock bar signal CLKb from the host 1100 through a clock pad CLK_p and a clock bar pad CLKb_p. For example, the clock buffer 1220 may be implemented to include a differential input buffer. The clock buffer 1220 may generate an internal clock signal based on the clock signal CLK and the clock bar signal CLKb that are received, for example, from an external device. The internal clock signal generated by the clock buffer is provided to the command decoder 1230.

The command decoder 1230 is provided with various commands through the command/address latch 1210 that are decoded. The command decoder 1230 is provided with the internal clock signal generated by the clock buffer 1220. The command decoder 1230 decodes the command from the command/address latch 1210 based on the internal clock signal received from the clock buffer 1220, and generates a decoding command CMD_i. The command decoder 1230 provides the decoding command CMD_i to components such as the row decoder 1253, the column decoder 1254, and the status circuit 1260. Also, the command decoder 1230 may generate a control signal CTRL for controlling the status circuit 1260 based on the provided internal clock signal from the clock buffer or command received from the command/address latch 1210. The control signal CTRL is provided to the status circuit 1260. The control signal CTRL will be more fully described with reference to FIGS. 3 and 6 herein below.

The voltage generator 1240 generates various voltages that are utilized for an operation of the memory device 1200*a*. For example, the voltage generator 1240 may generate a reference voltage provided to the data input/output driver 1270 to determine logic of data provided from the host 1100 and may provide the reference voltage to the data input/output driver 1270. Alternatively, the voltage generator 1240 may generate a word line voltage, a bit line voltage, an operating voltage of a core, etc. that are needed for an operation of a memory cell array 1251 and may provide these generated voltages to the core area 1250. To generate various voltages, the voltage generator 1240 may include a voltage pump circuit (not illustrated) for boosting a voltage. Although not illustrated in FIG. 2, to generate various voltages, the voltage generator 1240 may be provided with a voltage from a source (e.g., the host 1100) external to the memory device 1200*a*.

The core area 1250 may include the memory cell array 1251, a sense amplifier 1252, the row decoder 1253, and the column decoder 1254. The memory cell array 1251, the sense amplifier 1252, the row decoder 1253, and the column decoder 1254 may operate using the various voltages provided from the voltage generator 1240.

Data stored in the memory cell array 1251 may be provided to the data input/output driver 1270 through the sense amplifier 1252. The sense amplifier 1252 may have an interface to receive data from the memory cell array and output the data to the data input/output driver. Alternatively, data provided from the host 1100 may be stored in the memory cell array 1251 through the sense amplifier 1252 and the data input/output driver 1270. An address that is used to store or read data in or from a memory cell may be provided to the memory cell array 1251 through the command/address latch 1210, the row decoder 1253, and the column decoder 1254. In such a case, the column decoder provides the decoded column address (CA) and the row decoder 1253 provides the decoded row address (RA) to the memory cell array 1251.

With continued reference to FIG. 2, the status circuit 1260 may store operation status information STATUS associated with an operation failure in response to the control signal CTRL provided from the command decoder 1230. For example, the status circuit 1260 may operate only during a test operation of the memory device 1200*a*. Also, the status circuit 1260 may output the stored operation status information STATUS to the host 1100 through the data input/output driver 1270 and a DQ pad DQ_p in response to the control signal CTRL. Moreover, the status circuit may include, the status output information for a predetermined number of test operations, or for a predetermined period, at which point the status information may be stored externally from the memory device for access by the host.

For example, the operation status information STATUS may include at least one of the row address RA and the column address CA from the command/address latch. 1210, the decoding command CMD_i from the command decoder 1230, data DATA provided from the host 1100 to the data input/output driver 1270 during a write operation, and data DATA to be output to the host 1100 during a read operation, in the case where an operation failure of the memory device 1200*a* occurs.

Alternatively, the operation status information STATUS may include at least one of the decoding command CMD_i, the row address RA and the column address CA, and data DATA input and output by the data input/output driver 1270 at a plurality of time points before an operation failure occurs. By providing information at a plurality of time points before an operation failure occurs, the determination of the cause of operation failure can be enhanced. This information may be stored in a buffer and may be written over with new information as operations progress without an operation failure.

The status circuit 1260 may be reset only at power up of the memory device 1200*a*. For example, the status circuit 1260 may not be reset by an external reset signal after the memory device 1200*a* starts to operate by a power-up operation. Accordingly, even in a case where the memory device 1200*a* resets an operating environment in response to receiving the external reset signal after the operation failure occurs, the operation status information STATUS that is associated with the operation failure and is stored in the status circuit 1260 may not be reset.

The status circuit 1260 may be implemented, for example, with a multi-purpose register. Information of an operation status stored in the status circuit 1260 implemented with the multi-purpose register may be output to the host 1100 in response to a command provided from the host 1100. However, the inventive concept is not limited to an implementation of a multi-purpose register. An operation of the multi-purpose register may be defined by the JEDEC (Joint Electron Device Engineering Council) specification.

With continued reference to FIG. 2, the data input/output driver 1270 determines a logical level of data DATA provided from the host 1100 through the DQ pad DQ_p, based on the reference voltage (Vref) that is output by the voltage generator 1240. The data input/output driver 1270 provides the determined data DATA to the sense amplifier 1252. The data input/output driver 1270 may output data read from the memory cell array 1251 to the host 1100 through the DQ pad DQ_p. To this end, memory cells of the memory cell array 1251, in which data for input/output are stored, may be selected by the row decoder 1253 and the column decoder 1254 that are provided with the address. The data input/output driver 1270 may provide the status circuit 1260 with input/output data DATA_io provided to the sense amplifier 1252 or from the sense amplifier 1252. The data input/output driver 1270 outputs the operation status information STATUS provided from the status circuit 1260 to the host 1100.

Figure 3:
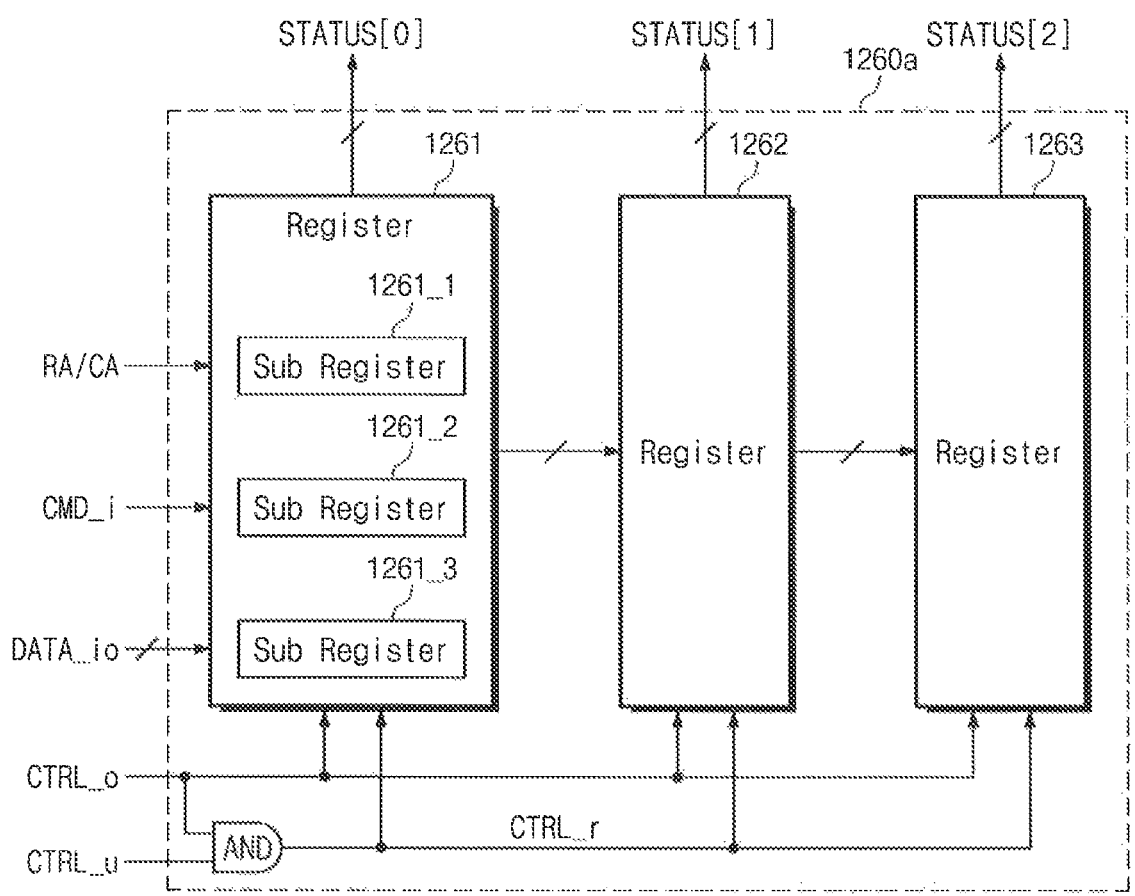
FIG. 3 is a block diagram illustrating a status circuit illustrated in FIG. 2.

FIG. 3 is a block diagram illustrating the status circuit shown in FIG. 2. The block diagram of FIG. 3 will be described with reference to FIGS. 1 and 2. Referring to FIG. 3, a status circuit 1260*a* may include first, second and third registers 1261, 1262 and 1263, and an AND gate.

The status circuit 1260*a* of FIG. 3 may store a first operation status information STATUS [0] when an operation failure of the memory device 1200*a* occurs, and a second and a third operation status information (STATUS [1] and STATUS [2]) at two time points prior to the occurrence of the operation failure. A point in time when the second and third operation status information STATUS [1] and STATUS [2] are stored may change according to a way an update control signal CTRL_u is provided. The update control signal CTRL_u will be more fully described below.

The control signal CTRL illustrated in FIG. 2 may include the update control signal CTRL_u and an output control signal CTRL_o. The update control signal CTRL_u is used to allow the status circuit 1260a to update and store operation status information. For example, in the case where the update control signal CTRL_u is activated, the first to third registers 1261 to 1263 update and store the first to third operation status information STATUS[0], STATUS[1] and STATUS[2], As shown in the example in FIG. 3, there is an AND gate in which the update control signal CTRL_u is one input and the output control signal CTRL_o is the other input.

In the embodiment of FIGS. 2 and 3, the update control signal CTRL_u may be provided from the command decoder 1230. For example, the update control signal CTRL_u may be generated by the command decoder 1230 whenever a valid command for a write, read, activation, or precharge operation, etc. is provided from the host 1100 to the memory device 1200a. Alternatively, the update control signal CTRL_u may be generated by the command decoder 1230 whenever an operation state of the memory device 1200a is changed.

In an embodiment of the inventive concept, the update control signal CTRL_u may be formed of the internal clock signal provided front the clock buffer 1220. The first to third registers 1261 to 1263 periodically update and store the first to third operation status information STATUS [0], STATUS [1] and STATUS [2] in response to the update control signal CTRL_u formed of the internal clock signal. In this case, the status circuit 1260a may be provided with the update control signal CTRL_u from the clock buffer 1220 and the output control signal CTRL_o from the command decoder 1230.

Below, for ease of description, it is assumed that the update control signal CTRL_u is generated by the command decoder 1230 whenever a valid command for a write, read, activation, or precharge operation, etc. is provided from the host 1100. The update control signal CTRL_u is provided to the status circuit 1260a. However, it may be understood from various embodiments to be described below that examples of the above-described update control signal CTRL_u may be easily applied.

With continued reference to FIG. 3, the update control signal CTRL_u is provided to each of the first to third registers 1261, 1262 and 1263 as a register control signal CTRL_r through the AND gate. The AND gate is provided with the update control signal CTRL_u and the output control signal CTRL_o. The AND gate outputs the update control signal CTRL_u as the register control signal CTRL_r without modification when the output control signal CTRL_o is activated to logic "1". The AND gate outputs the output control signal CTRL_o as the register control signal CTRL_r regardless of the update control signal CTRL_u when the output control signal CTRL_o is deactivated to logic "0".

The output control signal CTRL_o is used to output the first to third operation status information STATUS [0:2] being stored in the status circuit 1260a to the host 1100. In the embodiment shown in FIGS. 2 and 3, the output control signal CTRL_o may be provided from the host 1100 when an operation failure of the memory device 1200a is detected.

For example, the host 1100 may determine the operation failure of the memory device 1200a by comparing data read from the memory device 1200a with expected data. The host 1100 commands that the memory device 1200a outputs the operation status information STATUS, by using a combination of a command and an address. The command decoder 1230 of the memory device 1200a decodes the provided command and address to generate the output control signal CTRL_o. The first to third registers 1261 to 1263 output the first to third operation status information STATUS [0] to STATUS [2] to the host 1100 through the data input/output driver 1270 in response to the provided output control signal CTRL_o.

In an embodiment of the inventive concept, the output control signal CTRL_o may be generated when an abnormal situation of a specific signal or voltage being monitored in the memory device 1200a is detected. Alternatively, the output control signal CTRL_o may be provided from the host 1100 through a dedicated pad. Various embodiments will be discussed herein below in which the output control signal CTRL_o is provided.

With reference to FIG. 3, the first to third registers 1261 to 1263 may constitute a shift register. An operation of the first to third registers 1261 to 1263 is as follows. In response to the update control signal CTRL_u from the command decoder 1230 or the clock buffer 1220, the first to third registers 1261 to 1263 store the operation status information periodically or randomly provided before an operation failure of the memory device 1200a occurs. In the case where the operation failure of the memory device 1200a occurs, in response to receiving the output control signal CTRL_o from the host 1100, the first to third registers 1261 to 1263 output the operation status information that corresponds to a time point at which the operation failure of the memory device 1200a occurs, and a plurality of time points before the operation failure occurs.

The first to third registers 1261 to 1263 may be configured the same. Three registers are illustrated in FIG. 3 as one possible example. However, embodiments of the inventive concept may not be limited thereto. For example, the number of registers may be changed according to the number of time points, which correspond to a target to be checked, from among time points before the operation failure occurs. Below, the first register 1261 of the first to third registers 1261 to 1263 will be described as an example.

The first register 1261 may include a plurality of sub registers 1261_1, 1261_2, 1261_3. The sub registers 1261_1 to 1261_3 are provided with the row and column addresses RA and CA, the decoding command CMD_i, and the input/output data DATA_io from the command/address latch 1210, the command decoder 1230, and the data input/output driver 1270, respectively. In the case where the register control signal CTRL_r is activated, the sub registers 1261_1 to 1261_3 may update and store the row and column addresses RA and CA, the decoding command CMD_i, and the input/output data DATA_io, by which an operation of the memory device 1200a when it is determined that the register control signal CTRL_r is activated.

In the embodiment shown in FIG. 3, the sub register 1261_1 may be an address-dedicated register configured to store the row address RA and the column address CA. The sub register 1261_2 may be a command-dedicated register configured to store the decoding command CMD_i. The sub register 1261_3 may be a data-dedicated register configured to store the input/output data DATA_io.

Although FIG. 3 shows the number of sub registers 1261_1 to 1261_3 being three, a person of ordinary skill it the art should appreciate that the inventive concept is not be limited to three sub registers. For example, the number of the sub registers 1261_1 to 1261_3 and sizes thereof may be determined to store all of the above-described data RA, CA, CMD_i, and DATA_io.

For example, the input/output data DATA_io may be provided to the status circuit 1260a with a bus size corresponding to the number of DQ pads DQ_p. For example, in the case where the number of DQ pads DQ_p is "16", the bus of the input/output data DATA_io may include 16 transmission lines. Accordingly, the input/output data DATA_io may be provided to the status circuit 1260a through the bus including 16 transmission lines. Also, the input/output data DATA_io may include a serial bit stream of a length that is determined according to a burst length. The input/output data DATA_io including the serial bit stream may be input and output in response to one command. The sub register 1261_3 may be configured to store data including the size of the bus and a plurality of serial bit streams, in size and number.

In the case where the register control signal CTRL_r is activated, the first register 1261 provides the second register 1262 with the operation status information composed of an address, a command, and data stored in the first register 1261. Also, the first register 1261 updates and stores the operation status information in response to the activated register control signal CTRL_r.

Similar to the above description, in the case where the register control signal CTRL_r is activated, the second register 1262 provides the third register 1263 with the operation status information composed of an address, a command, and data stored in the second register 1262. Next, the second register 1262 updates and stores the operation status information in response to the activated register control signal CTRL_r. In the case where the register control signal CTRL_r is activated, the third register 1263 updates and stores the operation status information. In the above description, the first to third registers 1261 to 1263 may collectively constitute a shift register. The first to third registers 1261 to 1263 output the stored first, second and third operation status information STATUS[0], STATUS [1], STATUS[2] to the host 1100 through the data input/output driver 1270 and the DQ pad DQ_p in response to the output control signal CTRL_o.

Figure 4:
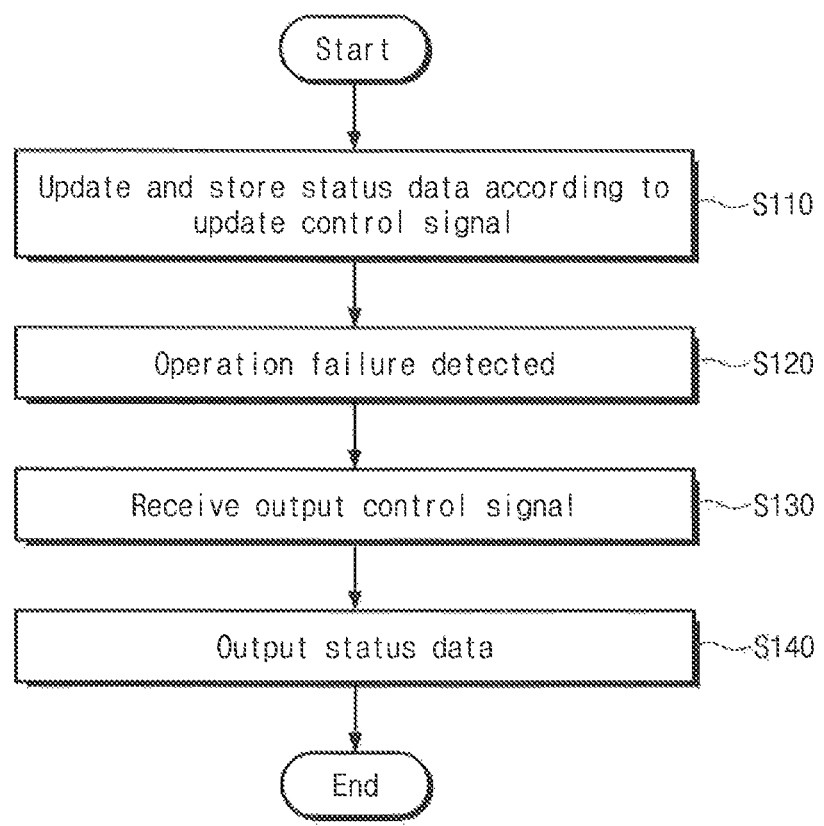
FIG. 4 is a flowchart illustrating an operation of the status circuit of FIG. 3.
Figure 5:
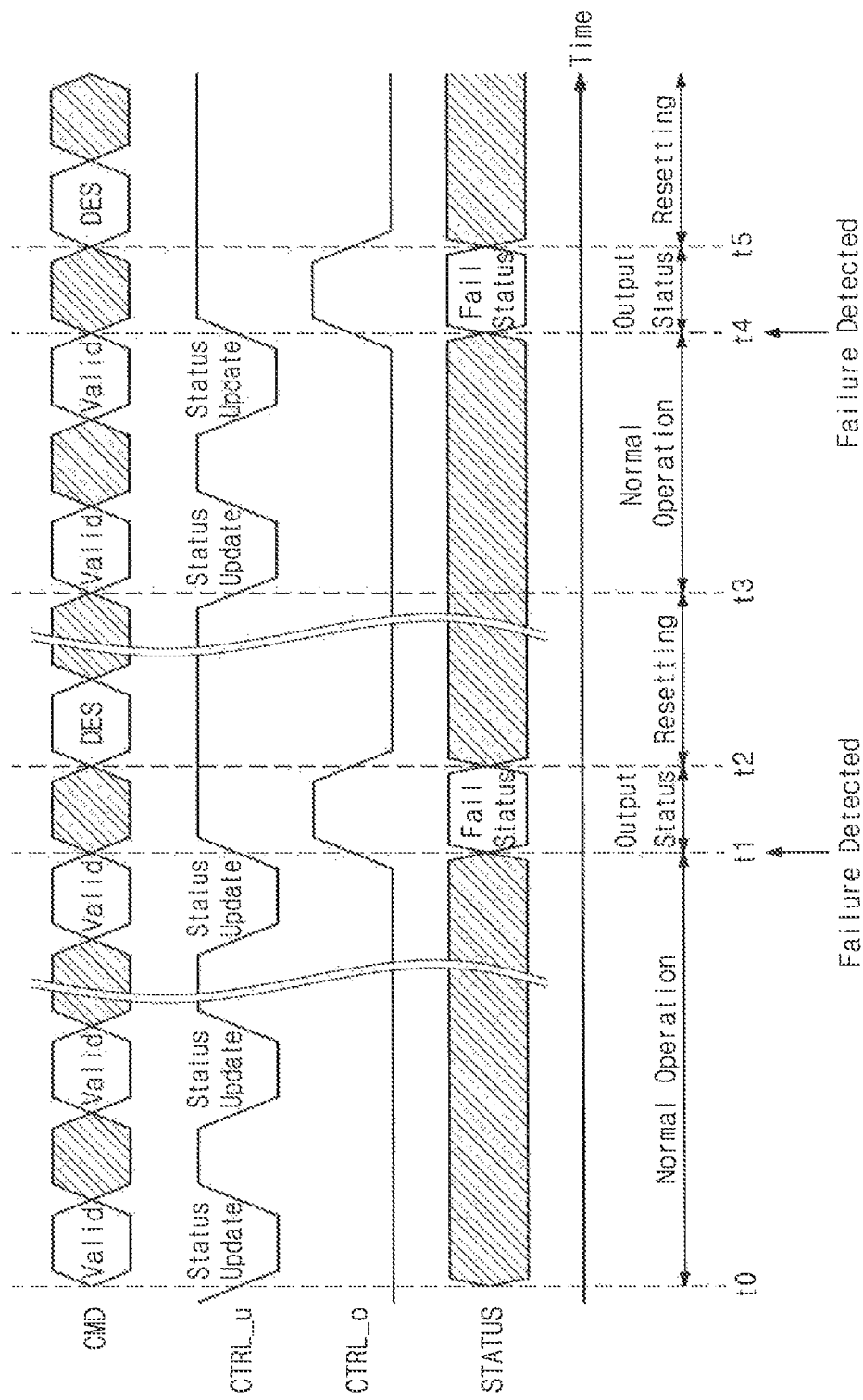
FIG. 5 is a timing diagram illustrating an operation of the status circuit of FIG. 3.

FIG. 4 is a flowchart illustrating an operation of the status circuit 1260a of FIG. 3, and FIG. 5 is a timing diagram illustrating an operation of the status circuit of FIG. 3. FIGS. 4 and 5 will be described with reference to the structure shown in FIGS. 1 to 3.

Referring to FIG. 4, in operation S110, the status circuit 1260a of the memory device 1200a updates and stores the operation status information STATUS in response to the update control signal CTRL_u and the register control signal CTRL_r. As described above, the status circuit 1260a stores the operation status information at periodic or random points until the output control signal CTRL_o is activated.

In operation S120, an operation failure of the memory device 1200a is detected. For example, as described above, the host 1100 may determine the operation failure of the memory device 1200a by comparing data read from the memory device 1200a with expected data. If the read data are different from the expected data, the host 1100 may determine that an operation failure of the memory device 1200a has occurred.

In an embodiment of the inventive concept, in the case where the memory device 1200a includes a comparator for comparing test data, the memory device 1200a may detect the operation failure through a data comparison operation. Alternatively, the memory device 1200a may detect the operation failure based on a result of monitoring a voltage drop of a specific voltage of the memory device 1200a. Various embodiments in which the operation failure of the memory device 1200a is detected and the output control signal CTRL_o is generated will be more fully described below. A person of ordinary skill in the art understands that the example embodiments disclosed herein below are provided for illustrative purposes, and the inventive concept is not limited to the examples.

If the operation failure is detected, in operation S130, the status circuit 1260a is provided with the output control signal CTRL_o. In the case where the operation failure is detected by the above-described methods, the output control signal CTRL may be generated in the host 1100 or the memory device 1200a. The status circuit 1260a is provided with the generated output control signal CTRL_o.

In operation S140, the status circuit 1260a outputs the first to third operation status information STATUS [0:2] to the host 1100 in response to the output control signal CTRL_o.

FIG. 5 illustrates a timing diagram of internal signals of the memory device 1200a generated according to an operation of the status circuit 1260a is illustrated in FIG. 5. In a time period from t0 to t1, the memory device 1200a performs a write or read operation in response to a command and an address provided from the host 1100. For example, in the case where an operation of the memory device 1200a is tested by the host 1100, under control of the host 1100, the memory device 1200a may perform an operation based on a pattern of IDD5, IDD7, etc. that are defined by the JEDEC specification.

Before the time point t1, the status circuit 1260a stores the operation status information STATUS of the memory device 1200a in response to the update control signal CTRL_u. The update control signal CTRL_u is illustrated in FIG. 5 as being generated whenever a valid command Valid is provided to the memory device 1200a. However, as described above, the update control signal CTRL_u as may be generated whenever an operation status of the memory device 1200a is changed or may be provided as a clock signal. At the time point t1, an operation failure of the memory device 1200a may be detected.

In a time period from t1 to t2, the output control signal CTRL_o is generated due to the operation failure of the memory device 1200a occurring at the time point t1. The status circuit 1260a outputs the first to third operation status information STATUS [0:2] to the host 1100 in response to the generated output control signal CTRL_o.

In a time period from t2 to t3, the host 1100 resets an operating environment of the memory device 1200a. For example, the operating environment may include an operating voltage, an operating frequency, etc. of the memory device 1200a. The host 1100 analyzes the operation status information of the memory device 1200a in which the operation failure occurs. Next, the host 1100 may change the operating environment of the memory device 1200a such that the memory device 1200a operates normally in the corresponding operation status. In the corresponding time period, the memory device 1200a is deselected (DES) and does not operate. However, as described above, the status circuit 1260a is not reset such that the stored first to third operation status information STATUS [0:2] are retained.

With continued reference to FIG. 5, in a time period from t3 to t4, the memory device 1200a operates normally after being reset between t2 to t3. In a time period from t3 to t5, operations of the host 1100 and the memory device 1200a are the same as those in a time period from t0 to t2. For example, in the time period from t3 to t4, the status circuit 1260a stores the operation status information STATUS of the memory device 1200a in response to the update control signal CTRL_u. In the time point t4, an operation failure of the memory device 1200a is detected. In a time period from t4 to t5, the status circuit 1260a outputs the stored first to third operation status information. STATUS [0:2] to the host 1100 in response to the generated output control signal CTRL_o. After the time point t5, the memory device 1200a is reset by the host 1100.

Figure 6:
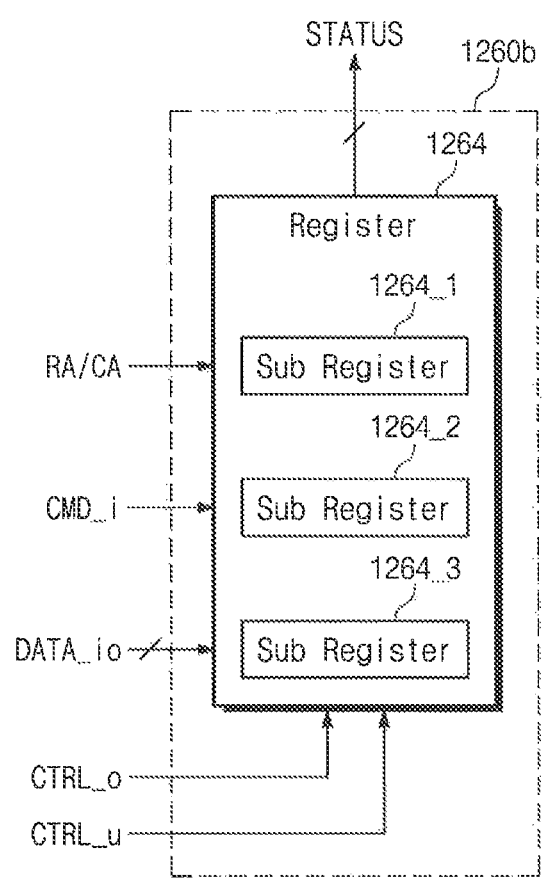
FIG. 6 is a block diagram illustrating the status circuit illustrated in FIG. 2, according to another embodiment of the inventive concept.

FIG. 6 is a block diagram illustrating the status circuit illustrated in FIG. 2, according to an embodiment of the inventive concept. The block diagram of FIG. 6 will be described with reference to FIGS. 1 and 2. Referring to FIG. 6, a status circuit 1260b may include a register 1264. As described above, the control signal CTRL may include the update control signal CTRL_u and the output control signal CTRL_o.

Compared with the status circuit 1260a of FIG. 3, the status circuit 1260b of FIG. 6 may store the operation status information STATUS in response to the update control signal CTRL_u that is generated when the operation failure of the memory device 1200a occurs. For example, the status circuit 1260b does not operate before the operation failure occurs. After the status circuit 1260b stores the operation status information STATUS, the status circuit 1260b outputs the stored operation status information STATUS to the host 1100 in response to the output control signal CTRL_o.

In the embodiments of FIGS. 2 and 6, it may be possible to detect the operation failure of the memory device 1200a through the various methods described with reference to FIGS. 4 and 5. In this case, the update control signal CTRL_u may be provided from the host 1100, or may be generated in the memory device 1200a.

For example, the update control signal CTRL_u may be provided from the host 1100 when the operation failure of the memory device 1200a is detected. The host 1100 may determine the operation failure of the memory device 1200a by comparing data read from the memory device 1200a with expected data. The host 1100 controls the memory device 1200a to output the operation status information STATUS, by using a combination of a command and an address. The command decoder 1230 of the memory device 1200a decodes the provided command and address to generate the update control signal CTRL_u. The register 1264 outputs the operation status information STATUS to the host 1100 through the data input/output driver 1270 in response to the provided update control signal CTRL_u.

In an embodiment of the inventive concept, the update control signal CTRL_u may be generated when an abnormal situation of a specific signal or voltage being monitored in the memory device 1200a is detected. For example, in the case where at least one of voltages generated by the voltage generator 1240 is lower than a preset level, the voltage generator 1240 may generate the update control signal CTRL_u. The update control signal CTRL_u may be generated through in a number of ways as previously discussed.

The status circuit 1260b outputs the stored operation status information STATUS in response to receiving the output control signal CTRL_o. In the embodiment of FIG. 6, the output control signal CTRL_o is provided from the command decoder 1230 under control of the host 1100.

A configuration and an operation of the register 1264 are similar to those of each of the first to third registers 1261 to 1263 illustrated in FIG. 3. For example, the register 1264 may include a plurality of sub registers 1264_1 to 1264_3. Configurations and operations of the sub registers 1264_1 to 1264_3 are the same or similar as described with reference to FIG. 3 and a description thereof is thus omitted.

The sub registers 1264_1 to 1264_3 are provided with the row and column addresses RA and CA, the decoding command CMD_i, and the input/output data DATA_io from the command/address latch 1210, the command decoder 1230, and the data input/output driver 1270, respectively. In the case where the update control signal CTRL_u is activated, the sub registers 1264_1 to 1264_3 update and store the row and column addresses RA and CA, the decoding command CMD_i, and the input/output data DATA_io, by which an operation of the memory device 1200a when the update control signal CTRL_u is activated is determined. The status circuit 1264b outputs the operation status information STATUS to the host 1100 through the data input/output driver 1270 and the DQ pad DQ_p in response to the output control signal CTRL_o.

Figure 7:
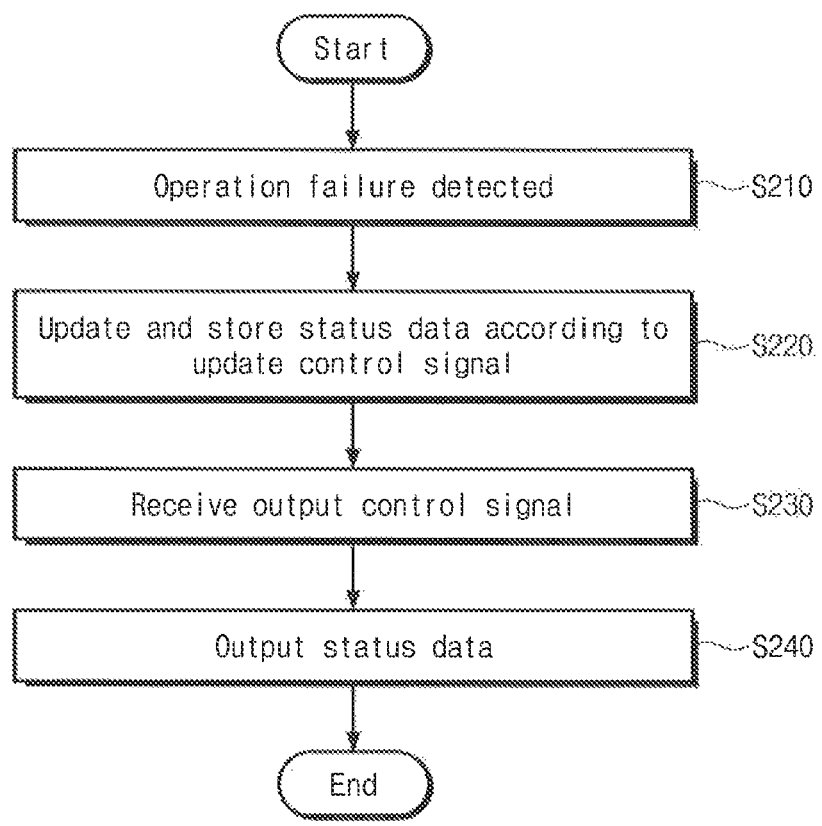
FIG. 7 is a flowchart illustrating an operation of the status circuit of FIG. 6.
Figure 8:
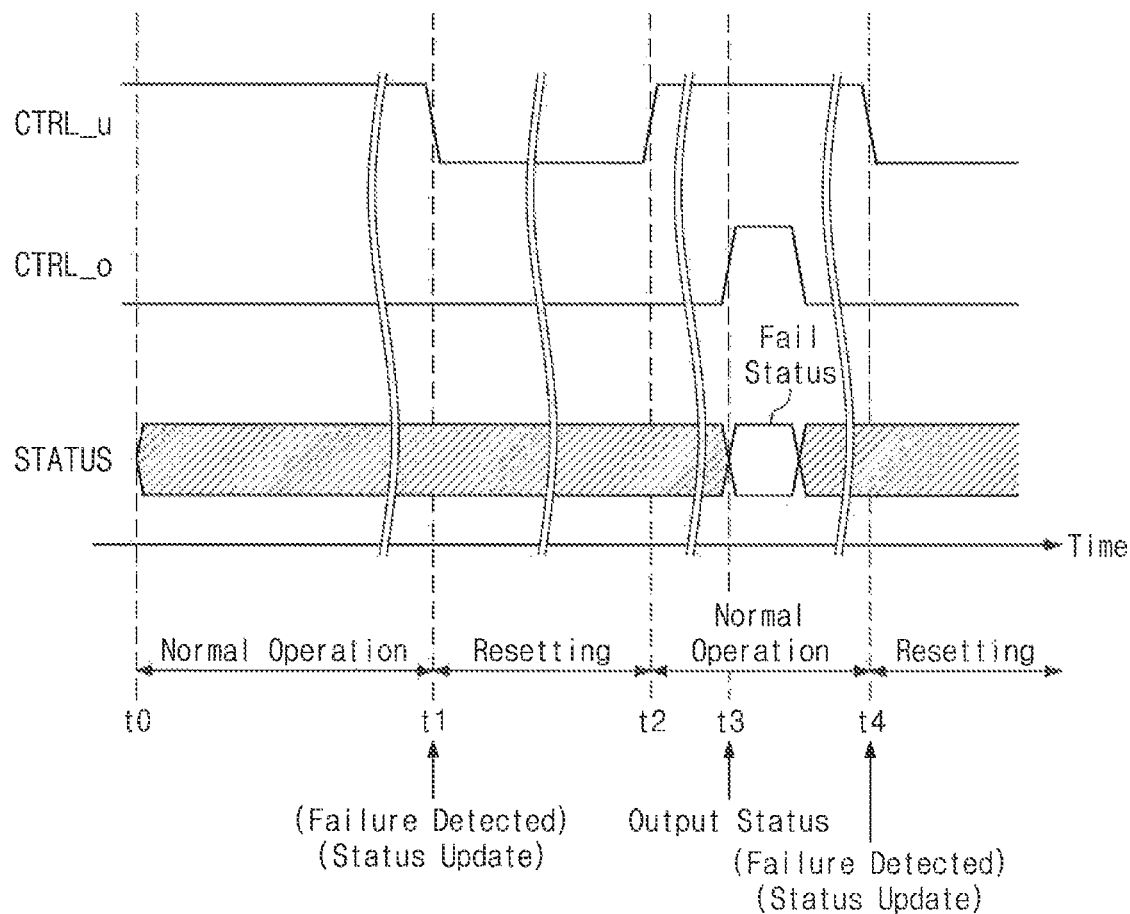
FIG. 8 is a timing diagram illustrating an operation of the status circuit of FIG. 6.

FIG. 7 is a flowchart illustrating an operation of the status circuit 1260b of FIG. 6, and FIG. 8 is a timing diagram further illustrating an operation of the status circuit of FIG. 6. FIGS. 7 and 8 will be described with reference to FIGS. 1, 2, and 6.

In operation S210, an operation failure of the memory device 1200a is detected. An example of one way the operation failure of the memory device 1200a may be detected is described with reference to FIGS. 4 and 6. Also, as described above, another way the operation failure may be detected win be described with reference to FIG. 10. In the case where the operation failure of the memory device 1200a is detected, the update control signal CTRL_u may be generated in the host 1100 or by the memory device 1200a. The update control signal CTRL_u is provided to the status circuit 1260b.

In operation S220, the status circuit 1260b updates and stores the operation status information STATUS in response to the provided update control signal CTRL_u. The updated status information can be used to analyze the operation failure.

In operation S230, the status circuit 1260b is provided with the output control signal. CTRL_o from the host 1100. In operation S240, the status circuit 1260b outputs the operation status information STATUS to the host 1100 in response to the output control signal CTRL_o. The host will typically analyze status information and control action of the memory device in view of the operation failure.

FIG. 8 provides a timing diagram of internal signals of the memory device 1200a generated according to an operation of the status circuit 1260b. In a time period from t0 to t1, the memory device 1200a performs a write or read operation, etc. in response to a command and an address provided from the host 1100. As described in the time period from t0 to t1 of FIG. 5, under control of the host 1100, the memory device 1200a may perform an operation based on a pattern of IDD5, IDD7, etc. that are defined by the JEDEC specification.

At a time point t1, an operation failure of the memory device 1200a is detected, and the update control signal CTRL_u is activated to a logic "0". Also, in response to the activated update control signal CTRL_u, the status circuit 1260b updates and stores the operation status information STATUS of the memory device 1200a at the time point t1.

With continued reference to FIG. 8, in a time period from t1 to t2, the host 1100 resets an operating environment of the memory device 1200a. In the corresponding time period, the memory device 1200a is deselected and does not operate.

However, as described above, the status circuit 1260*b* is not reset such that the stored operation status information STATUS is retained.

In a time period from t2 to t3, the memory device 1200*a* operates in the reset operating environment. At a time point t3, the memory device 1200*a* is provided with a command from the host 1100 for outputting the operation status information STATUS. The command decoder 1230 of the memory device 1200*a* generates the output control signal CTRL_o of logic "1" based on the provided command.

In a time period from t3 to t4, the status circuit 1260*b* outputs the operation status information STATUS to the host 1100 in response to receiving the output control signal CTRL_o. The operation status information STATUS includes operation status information of the memory device 1200*a* when the operation failure occurs. At a time point t4, an operation failure of the memory device 1200*a* is detected as described at the time point t1 As the operation failure of the memory device 1200*a* is detected, the update control signal CTRL_u is activated to the logic "0". The status circuit 1260*b* updates and stores the operation status information STATUS of the memory=device 1200*a* at the time point t4. After the operation status information STATUS is updated, the host 1100 resets an operating environment of the memory device 1200*a*.

Figure 9:
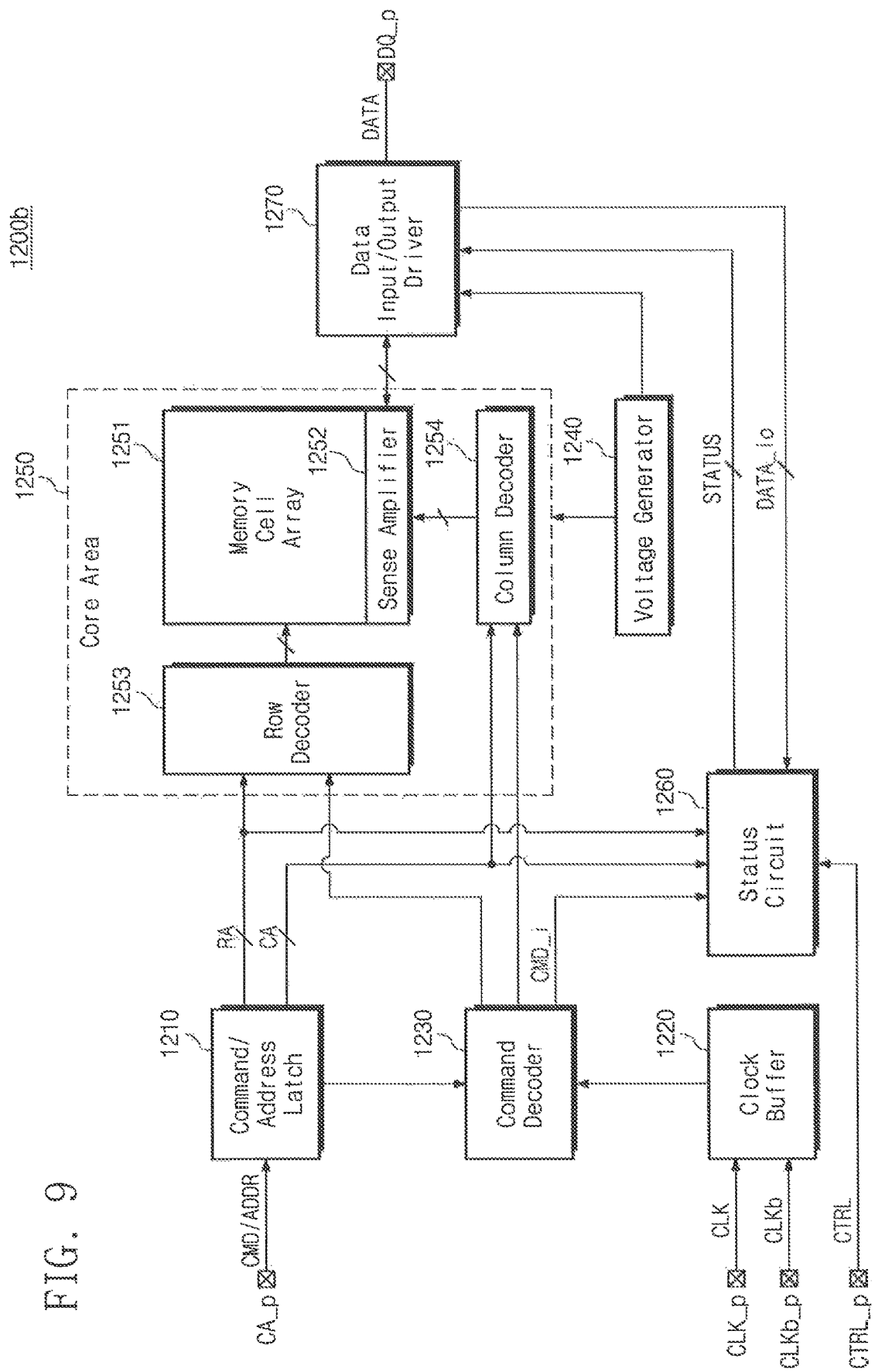
FIGS. 9 to 11 are block diagrams illustrating the memory device illustrated in FIG. 1, according to another embodiment of the inventive concept.
Figure 10:
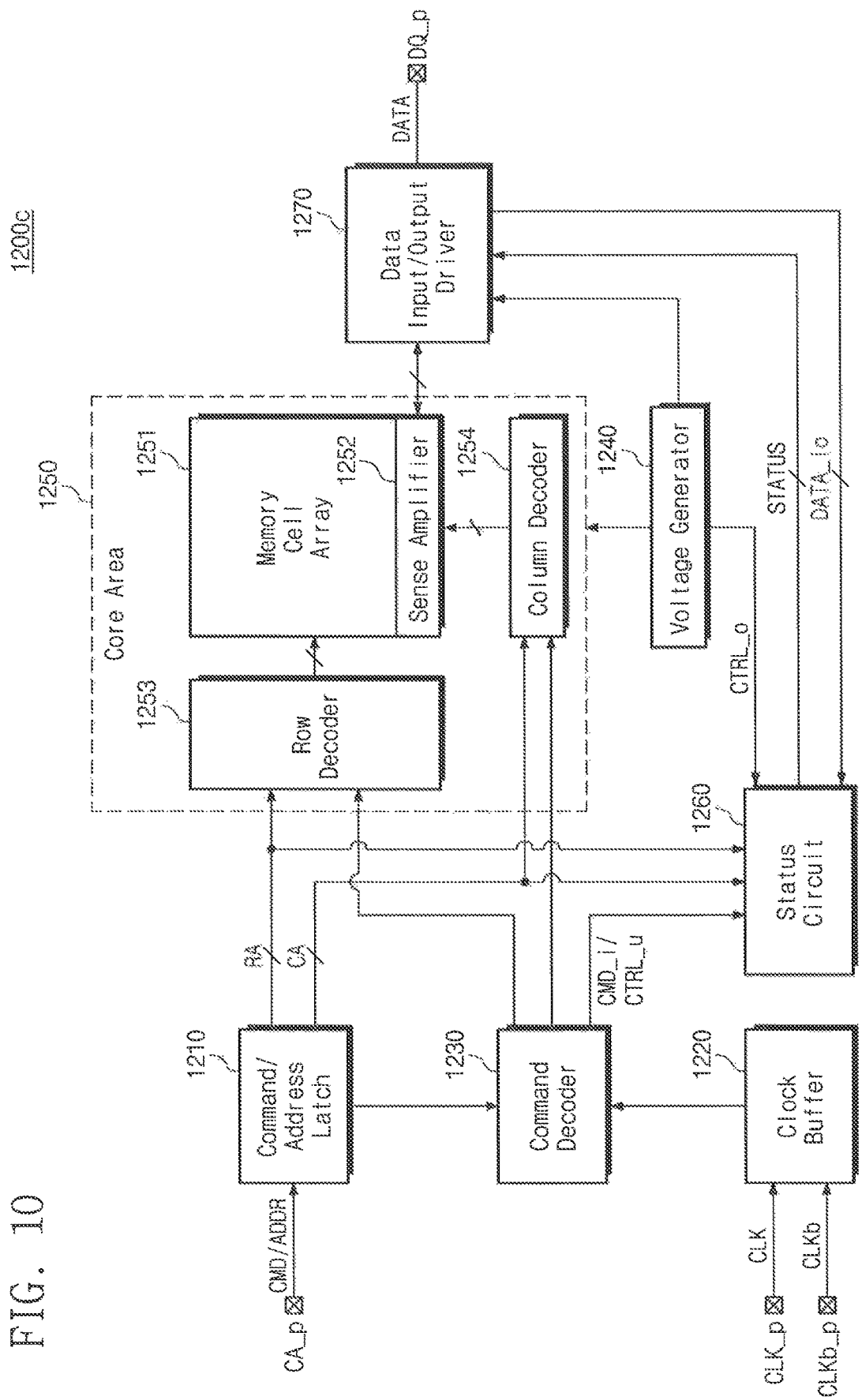
Figure 11:
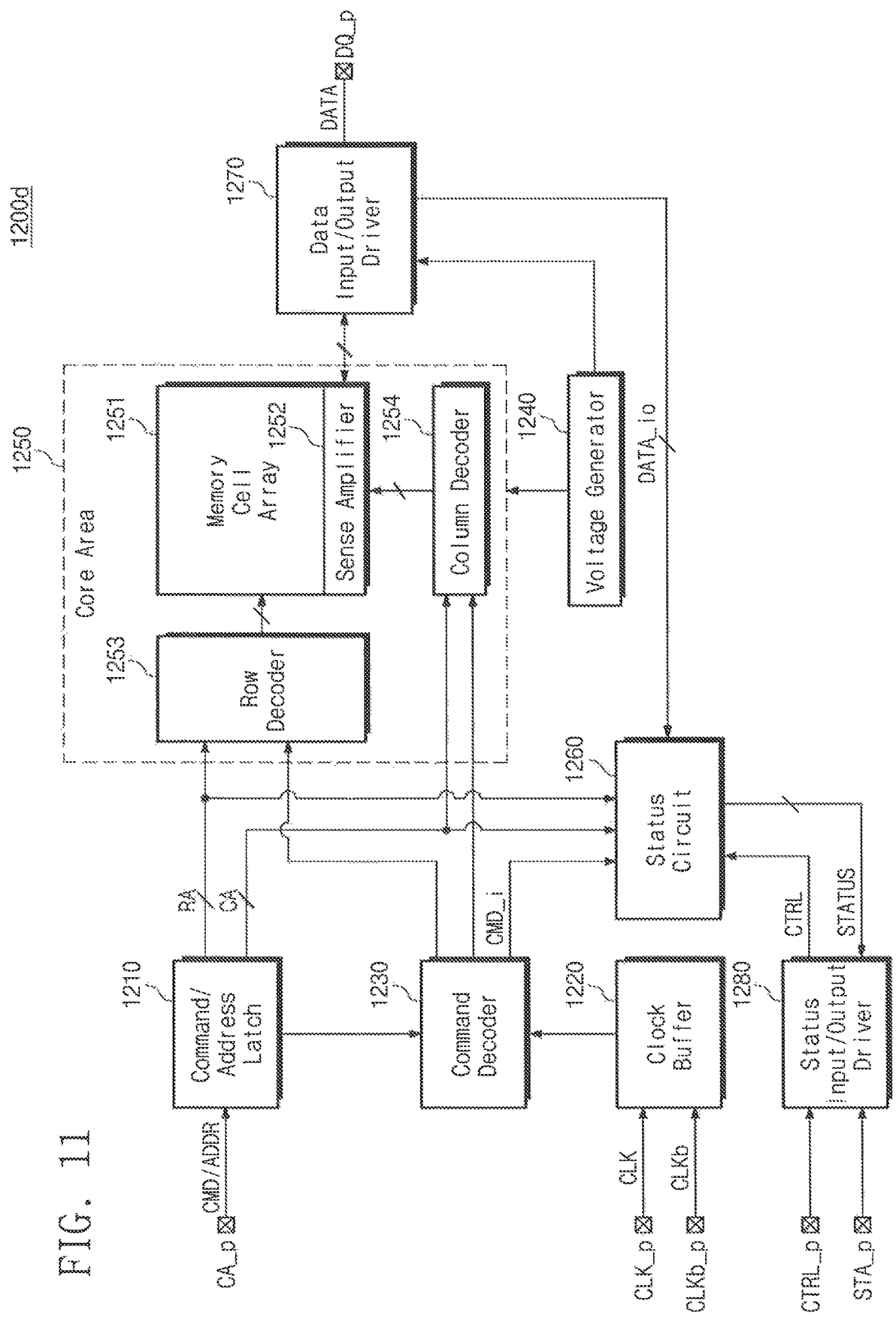

FIGS. 9 to 11 are block diagrams illustrating the memory device illustrated in FIG. 1, according to an embodiment of the inventive concept. The block diagrams of FIGS. 9 to 11 will now be described with reference to FIGS. 1 to 8.

Referring now to FIG. 9, a memory device 1200*b* may include the command/address latch 1210, the clock buffer 1220, the command decoder 1230, the voltage generator 1240, the core area 1250, the status circuit 1260, and the data input/output driver 1270. Also, the memory device 1200*b* may further include a CTRL pad CTRL_p for receiving the control signal CTRL, which is shown as being connected to the status circuit 1260.

Compared with the status circuit 1260 of the memory device 1200*a* of FIG. 2, the status circuit 1260 of the memory device 1200*b* shown in FIG. 9 is provided with the control signal CTRL through the CTRL pad CTRL_p from the host 1100. In FIG. 2, the status circuit 1260 receives the control signal CTRL from the command decoder 1230. Accordingly, the command decoder 1230 shown in FIG. 9 provides the decoding command CMD_i to the status circuit 1260, but does not provide the control signal CTRL to the status circuit 1260.

As described above, the control signal CTRL may include both the update control signal CTRL_u and the output control signal CTRL_o. Accordingly, although not illustrated in FIG. 9, the CTRL pad CTRL_p may include two pads for receiving the update control signal CTRL_u and the output control signal CTRL_o, respectively.

The CTRL pad CTRL_p may include an existing pad that is used for an operation of the memory device 1200*b*. For example, the CTRL pad CTRL_p may include a data bus inversion (DBI) pad, a data mask (DM) pad, a PAR pad, etc. For example, the memory device 1200*b* may use a pad, which is not used during an operation such as a read operation or a write operation, as the CTRL pad CTRL_p.

Except for the above description, configurations and operations of the command/address latch 1210, the clock buffer 1220, the command decoder 1230, the voltage generator 1240, the core area 1250, the status circuit 1260, and the data input/output driver 1270 are similar to or the same as described with reference to FIG. 2.

The status information STATUS of the memory device 1200*b* will be stored and output as follows. In the case where an operation failure of the memory device 1200*b* occurs, the status circuit 1260 is provided with the update control signal CTRL_u from the host 1100 through the CTRL pad CTRL_p. In response to the update control signal CTRL_u, the status circuit 1260 stores the operation status information STATUS associated with the operation failure that is occurring.

Next, the status circuit 1260 is provided with the output control signal CTRL_o from the host 1100 through the CTRL pad CTRL_p. The status circuit 1260 outputs the stored operation status information STATUS to the host 1100 through the data input/output driver 1270 and the DQ pad DQ_p in response to the output control signal CTRL_o.

Referring to FIG. 10, a memory device 1200*c* may include the command/address latch 1210, the clock buffer 1220, the command decoder 1230, the voltage generator 1240, the core area 1250, the status circuit 1260, and the data input/output driver 1270.

Compared with the status circuit 1260 of the memory device 1200*a* of FIG. 2, the status circuit 1260 of the memory device 1200*c* in FIG. 10 is provided with the output control signal CTRL_o from the voltage generator 1240, whereas in FIG. 2 the output control signal CTRL_o is received from the command decoder 1230. Accordingly, the command decoder 1230 provides the decoding command CMD_i and the update control signal CTRL_u to the status circuit 1260 and does not provide the output control signal CTRL_o to the status circuit 1260. However, as described with reference to FIG. 2, the status circuit 1260 may be provided with the internal clock signal from the clock buffer 1220 as the update control signal CTRL_u.

The voltage generator 1240 generates various voltages that are needed for an operation of the memory device 1200*c*. In the case where at least one of voltages generated by the voltage generator 1240 is lower than a preset voltage due to an unstable supply voltage, the memory device 1200*c* may fail to perform a normal operation. In this case, the voltage generator 1240 may determine that an operation failure of the memory device 1200*c* has occurred and may generate the output control signal CTRL_o. The generated output control signal CTRL_o is provided to the status circuit 1260.

Except for the above description regarding FIG. 10, the configurations and operations of the command/address latch 1210, the clock buffer 1220, the command decoder 1230, the voltage generator 1240, the core area 1250, the status circuit 1260, and the data input/output driver 1270 are similar to or the same as described with reference to FIG. 2.

The status information STATUS of the memory device 1200*c* will be stored and output as follows. First, in response to the update control signal CTRL_u provided from the command decoder 1230, the status circuit 1260 stores operation status information periodically or randomly prior to the output control signal CTRL_o is provided from the voltage generator 1240. In the case where the operation failure that a voltage generated by the voltage generator 1240 is lower than a preset voltage is detected, the voltage generator 1240 generates the output control signal CTRL_o. The status circuit 1260 is provided with the output control signal CTRL_o from the voltage generator 1240. The status circuit 1260 outputs the stored operation status information STATUS to the host 1100 through the data input/output driver 1270 and the DQ pad DQ_p in response to the output control signal CTRL_o.

Referring now to FIG. 11, a memory device 1200d may include the command/address latch 1210, the clock buffer 1220, the command decoder 1230, the voltage generator 1240, the core area 1250, the status circuit 1260, and the data input/output driver 1270. The memory device 1200d may further include a status input/output driver 1280, the CTRL pad CTRL_p, and a status pad STA_p.

Compared with the status circuit 1260 of the memory device 1200a of FIG. 2, the status circuit 1260 of the memory device 1200d is provided with the control signal CTRL through the CTRL pad CTRL_p and the status input/output driver 1280 from the host 1100, whereas in FIG. 2 the control signal CTRL is received by the status circuit 1260 from the command decoder 1230. Accordingly, the command decoder 1230 provides the decoding command CMD_i to the status circuit 1260, but in the configuration shown in FIG. 11 does not provide the control signal CTRL to the status circuit 1260. The status input/output driver 1280 provides the control signal CTRL to the status circuit 1260.

As described above, the control signal CTRL may include the update control signal CTRL_u and the output control signal CTRL_o. Accordingly, although not illustrated in FIG. 11, the CTRL pad CTRL_p may include two pads for receiving the update control signal CTRL_u and the output control signal CTRL_o, respectively. Compared with the CTRL pad CTRL_p of the memory device 1200b of FIG. 9, the CTRL pad CTRL_p may be implemented with a separate pad that is not associated with an operation of the memory device 1200d.

The status circuit 1260 stores an operation status of the memory device 1200d in response to the control signal CTRL provided through the CTRL pad CTRL_p and the status input/output driver 1280. The status circuit 1260 outputs the stored operation status information STATUS to the host 1100 through the status input/output driver 1280 and the status pad STA_p in response to receiving the control signal CTRL.

With continued reference to FIG. 11, the status input/output driver 1280 may communicate with the host 1100 by an interface that is separate from an interface for communicating between the host 1100 and memory device 1200d to perform normal operations such as a read operation and a write operation. Accordingly, the memory device 1200d may receive the control signal CTRL from the host 1100 even while performing an operation such as the read operation or the write operation. Also, the memory device 1200d may provide the operation status information STATUS to the host 1100 while performing an operation such as the read operation or the write operation. With the above description, the control signal CTRL may be received from the host 1100 regardless of the clock signal CLK, and the operation status information STATUS may be output to the host 1100 regardless of the clock signal CLK. In other words, in this example there is not a dependency on the clock signal CLK to receive the control signal CTRL and to output operation status information.

For example, the status input/output driver 1280 may communicate with the host 1100 through the IEEE 1500 interface that is defined by the JEDEC specification. In the case where the status input/output driver 1280 communicates with the host 1100 through the IEEE 1500 interface, the CTRL pad CTRL_p may include a wrapper scan in (WSI) pad, and the status pad STA_P may include a wrapper scan out (WSO) pad.

Except for the above description, configurations and operations of the command/address latch 1210, the clock buffer 1220, the command decoder 1230, the voltage generator 1240, the core area 1250, the status circuit 1260, and the data input/output driver 1270 are similar or the same as described with reference to FIG. 2.

The status information STATUS of the memory device 1200d will be stored and output as follows. In the case where an operation failure of the memory device 1200d occurs, the status circuit 1260 is provided with the update control signal CTRL_u from the host 1100 through the CTRL pad CTRL_p and the status input/output driver 1280. In response to the update control signal CTRL_u, the status circuit 1260 stores the operation status information STATUS associated with the operation failure that is occurring.

With regard to output of the status information, the status circuit 1260 is provided with the output control signal CTRL_o from the host 1100 through the CTRL pad CTRL_p and the status input/output driver 1280. The status circuit 1260 outputs the stored operation status information STATUS to the host 1100 through the status input/output driver 1280 and the status pad STA_p in response to the output control signal CTRL_o.

Various embodiments of the status circuit 1260 and the memory device 1200 including the status circuit 1260 according to the inventive concept are described above. However, the inventive concept is not limited to the embodiments described with reference to FIGS. 1 to 11. For example, various embodiments described in this specification may be implemented in which some of the teachings of the embodiments may be combined or some thereof may be omitted. For example, in the memory device 1200d of FIG. 11, the status circuit 1260 may be configured to receive the output control signal CTRL_o from the voltage generator 1240 as the memory device 1200c of FIG. 10. As such, embodiments described in this specification may be easily combined by one skilled in the art.

Figure 12:
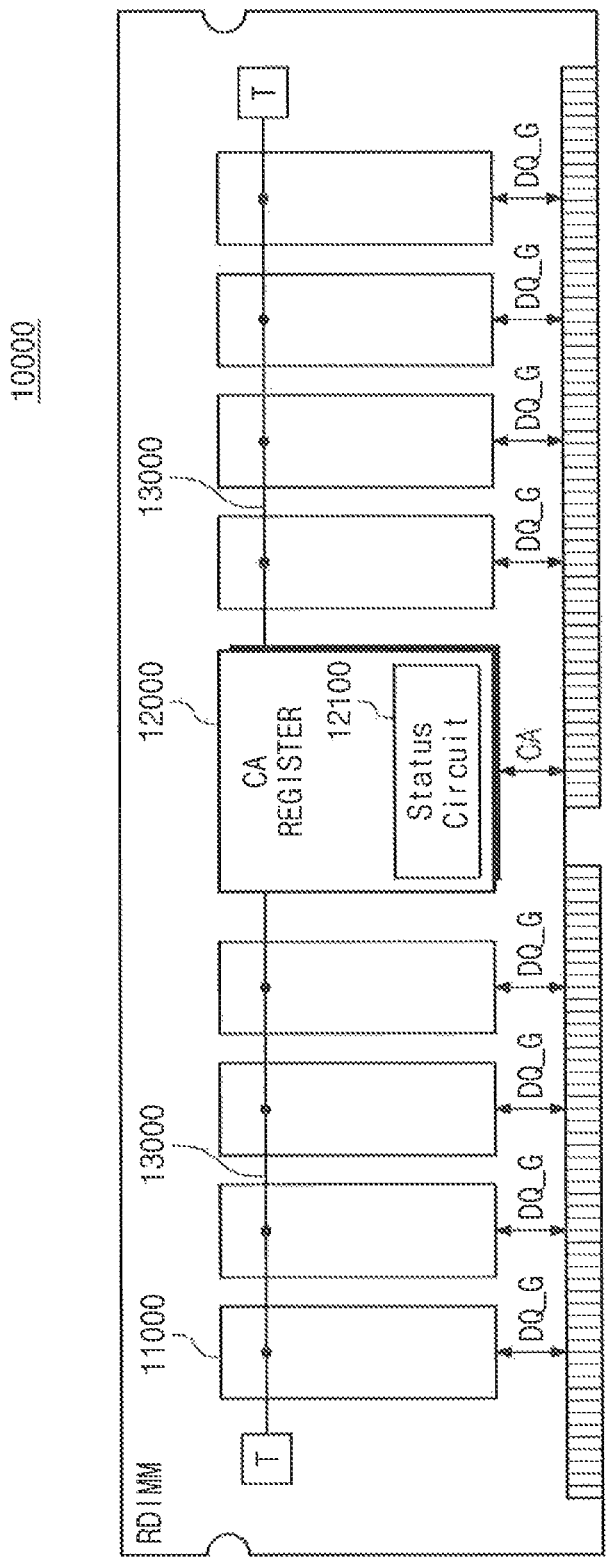
FIGS. 12 and 13 are block diagrams illustrating a memory module including the status circuit, according to another embodiment of the inventive concept.
Figure 13:
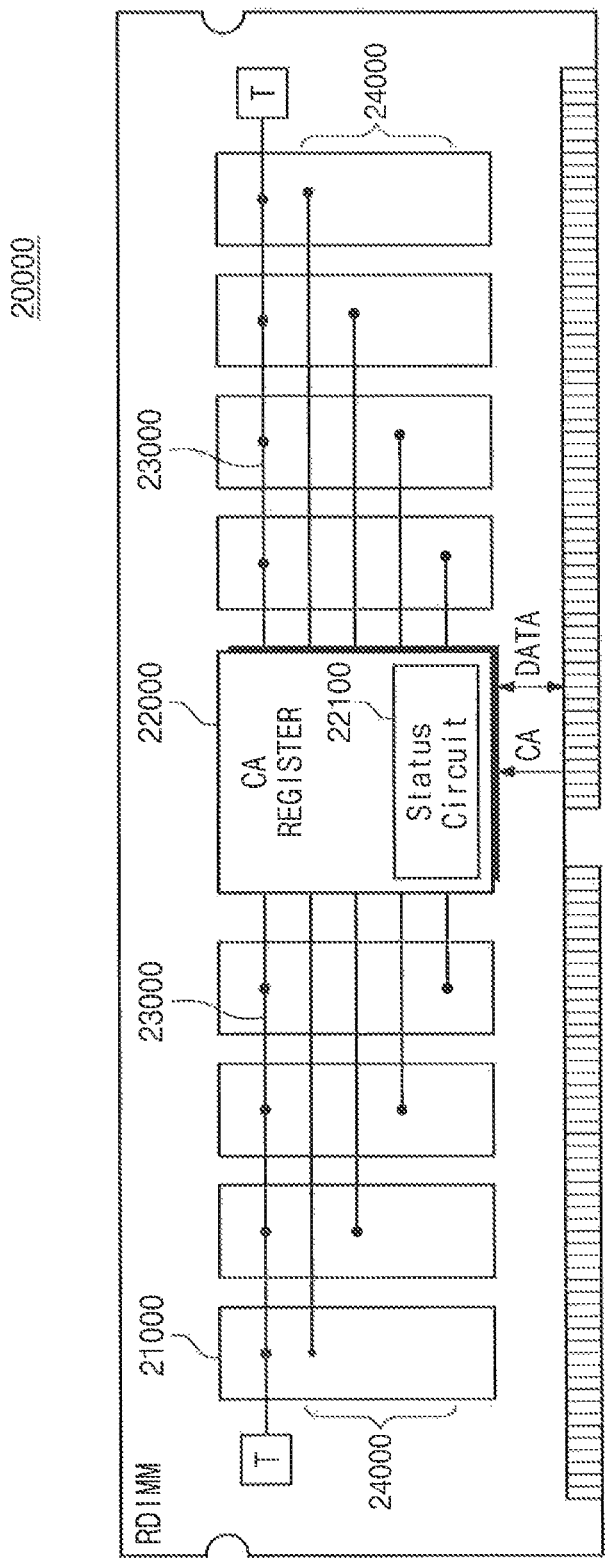

FIGS. 12 and 13 are block diagrams illustrating a memory module including the status circuit, according to an embodiment of the inventive concept. Memory modules 10000 and 20000 illustrated in FIGS. 12 and 13 have a registered dual in-line memory module (RDIMM) structure. Each of the memory modules 10000 and 20000 may include the status circuit 1260 described with reference to FIGS. 1 to 11.

An A-type memory module 10000 having the RDIMM form is illustrated in FIG. 12. The A-type memory module 10000 may include a memory device 11000, a command/address (CA) register 12000, and a CA transmission line 13000.

The memory device 11000 is connected with the CA register 12000 through the CA transmission line 13000. To reduce the load of an output part of a host, the CA register 12000 may serve as a buffer of an address or a command to be sent from the host to the memory device 11000. The CA transmission line 13000 may include termination resistors T at ends of the CA transmission line 13000 to remove a reflected wave generated when a command/address is transmitted.

In the RDIMM structure, in the case where a host accesses the memory device 11000, the host directly exchanges data with the memory device 11000 through an independent transmission line DQ_G. In contrast, the host provides an address or a command to each memory device 11000 through the CA register 12000.

The CA register 12000 may include a status circuit 12100. In response to the update control signal CTRL_u provided from the host, the status circuit 12100 of the CA register 12000 may receive and store operation status information from the memory device 11000 through the CA transmission line 13000. Also, in response to the output control signal provided from the host, the status circuit 12100 provides the stored operation status information to the host through a CA line CA. Here, the operation status information may include a command and an address that correspond to an operation of the memory device 11000. However, the operation status information may not include input/output data that correspond to an operation of the memory device 11000.

The CA line CA may have both a direction from the CA register 12000 to the host and a direction from the host to the CA register 12000. In the embodiment of FIG. 12, since the host is provided with the operation status information associated with a plurality of memory devices including the memory device 11000 from the status circuit 12100 by using one command, it may be possible to easily manage the operation status information.

A B-type memory module 20000 having the LRDIMM form is illustrated in FIG. 13. The B-type memory module 20000 may include a memory device 21000, a memory buffer 22000, and a CA transmission line 23000, and a data transmission line 24000.

Each of a plurality of memory devices including the memory device 21000 is connected with the memory buffer 22000 through the CA transmission line 23000 and the data transmission line 24000. The memory buffer 22000 performs a role of reducing the load of the output part of the host. The CA transmission line 23000 may include termination resistors T at ends of the CA transmission line 23000 to remove a reflected wave generated when a command/address is transmitted. The data transmission line 24000 may include a plurality of transmission lines for receiving data from each of the plurality of memory devices including the memory device 21000 or for providing data to each of the plurality of memory devices. The plurality of transmission lines may respectively correspond to the plurality of memory devices, and each transmission line may be connected between the memory buffer 22000 and the corresponding memory device.

In the LRDIMM structure, in the case where the host accesses the memory device 21000, the host indirectly exchange commands, addresses, and data with the memory device 21000 through the memory buffer 22000, the CA transmission line 23000, and the data transmission line 24000.

The memory buffer 22000 may include a status circuit 22100. In response to the update control signal CTRL_u provided from the host, the status circuit 22100 may receive and store operation status information from the memory device 21000 through the CA transmission line 23000 and the data transmission line 24000. Also, in response to the output control signal CTRL_o provided from the host, the status circuit 22100 provides the stored operation status information to the host through a DATA line. Here, the operation status information may include a command, an address, and input/output data that correspond to an operation of the memory device 21000.

In the embodiment of FIG. 13, the host is provided with the operation status information associated with a plurality of memory devices including the memory device 21000 from the status circuit 22100 by using one command, and it may be possible to easily manage the operation status information.

Figure 14:
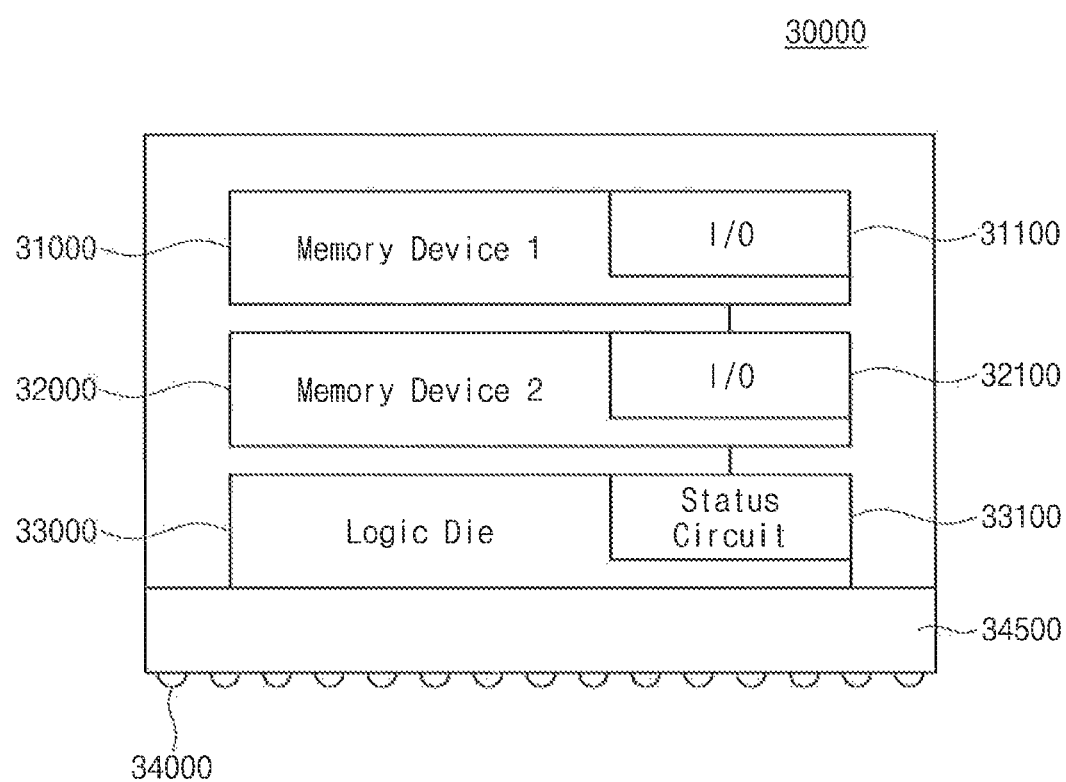
FIG. 14 is a block diagram illustrating a stacked memory including the status circuit, according to another embodiment of the inventive concept.

FIG. 14 is a block diagram illustrating a stacked memory including the status circuit, according to an embodiment of the inventive concept. Referring to FIG. 14, a stacked memory device 30000 may include first and second memory devices 31000 and 32000, a logic die 33000, and solder balls 34000. The number of stacked memory devices is not limited to that illustrated in FIG. 14.

The first and second memory devices 31000 and 32000 may include interfaces 31100 and 32100, respectively. The first and second memory devices 31000 and 32000 may be connected to each other through silicon vias (TSVs). Also, the first and second memory devices 31000 and 32000 may be connected to the logic die 33000 through the TSVs. Accordingly, the first and second memory devices 31000 and 32000 may communicate with a status circuit 33100 of the logic die 33000 through the interfaces 31100 and 32100 and the TSVs. There may be certain communications that are sent through the interfaces, and other communications that utilize the TSVs.

The logic die 33000 (e.g. logic circuit) may include the status circuit 33100 and may be arranged on substrate 34500. The status circuit 33100 may include the status circuit 1260 described with reference to FIGS. 1 to 11. In response to receiving the update control signal CTRL_u provided from the host, the status circuit 33100 may receive and store operation status information from each of the first and second memory devices 31000 and 32000 connected through the interfaces 31100 and 32100 and the TSVs. Also, in response to the output control signal provided from the host, the status circuit 33100 provides the stored operation status information to the host through the solder balls 34000. Here, the operation status information may include a command, an address, and input/output data that correspond to an operation of each of the first and second memory devices 31000 and 32000. The update control signal CTRL_u may be periodically or at random intervals provided from the host during normal operations so that certain operation information that occurs can be subsequently analyzed in the event of an operation failure. The failure may be analyzed faster and in a more exact manner with the operation status information that occurred during a time prior to the detection of an operation failure.

In the embodiment of FIG. 14, since the host is provided with operation status information of each of the first and second memory devices 31000 and 32000 by one command, it may be possible to increase the efficiency in which the operation status information is managed. A structure of memory devices (e.g. memory circuits) stacked and communicatively connected by the TSVs is illustrated in FIG. 14 as an example of the stacked memory device 30000. However, the embodiments of the inventive concept are not limited thereto. It should be understood and appreciated by a person of ordinary skill in the art that the example of FIG. 14 is applicable to all stackable memory forms including a package on package (PoP) as well as the TSV. Moreover, as there may be a plurality of stacked memory devices, while there has been a discussion herein above regarding a single output control signal can result in all of the vertically stacked memories to report operation status information to the status circuit for output to the host, the inventive concept also includes an embodiment in which a portion (e.g. more than one, but not all) of the vertically stacked memory devices may provide operation status information to the status circuit in response to one command provided by the host. A single memory device (e.g. memory circuit) may also provide operation status information.

Figure 15:
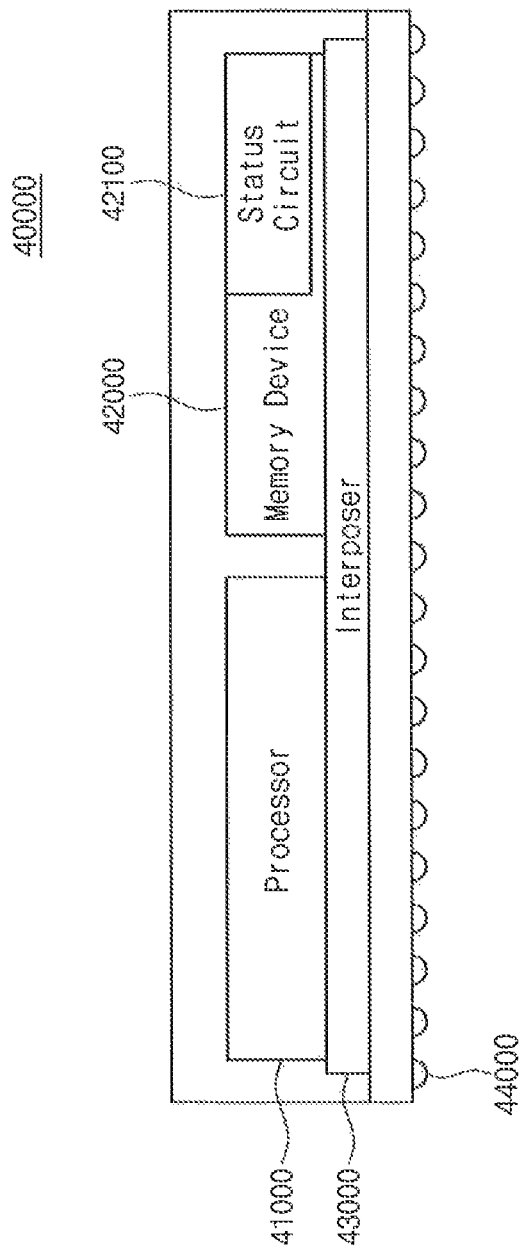
FIG. 15 is a view illustrating a processor in memory (PIM) including a memory device, according to an embodiment of the inventive concept.

FIG. 15 is a view illustrating a processor in memory (PIM) including a memory device, according to an embodiment of the inventive concept. Referring to FIG. 15, a PIM 40000 may include a processor 41000, a memory device 42000, an interposer 43000, and solder balls 44000.

The processor 41000 may correspond to the host 1100 illustrated in FIG. 1. For example, the processor 41000 may be a processor circuit or system that includes a general-purpose processor or an application processor. Alternatively, the processor 41000 may be the following computing device including one or more processors: a personal computer, a peripheral device, a digital camera, personal digital assistant (PDA), a portable media player (PMP), a smartphone, a tablet computer, or a wearable device.

The memory device 42000 may include at least one of memory devices 1200a to 12000d described with reference to FIGS. 1 to 11. The memory device 42000 may include a status circuit 42100. The status circuit 42100 may include the status circuit 1260 described with reference to FIGS. 1 to 11. The memory device 42000 may include the memory modules 10000 and 20000 described with reference to FIGS. 12 and 13. Alternatively, the memory device 42000 may include the stacked memory device 30000 described with reference to FIG. 14.

The memory device 42000 may communicate with the processor 41000 through the interposer 43000. The interposer may be arranged on a substrate, and for example, one or more processors, the logic die, etc. may be disposed on the interposer. The interposer may be constructed of known materials (e.g. silicon), and may be attached to a substrate using, for example, bumps. The substrate may, on an opposite side, include bumps for connection to, for example, a board, etc. The interposer may provide a communication path between the memory device, and, for example, one or more processors. The memory device 42000 including the status circuit 42100 may operate according to the method described with reference to FIGS. 1 to 14 under control of the processor 41000. The memory device 42000 may provide stored operation status information STATUS to the processor 41000 in response to a command of the processor 41000. According to the embodiment of FIG. 15, the processor 41000 or a user may be provided with the operation status information STATUS of the memory device 42000 and may analyze an operation failure of the memory device 42000.

Figure 16A:
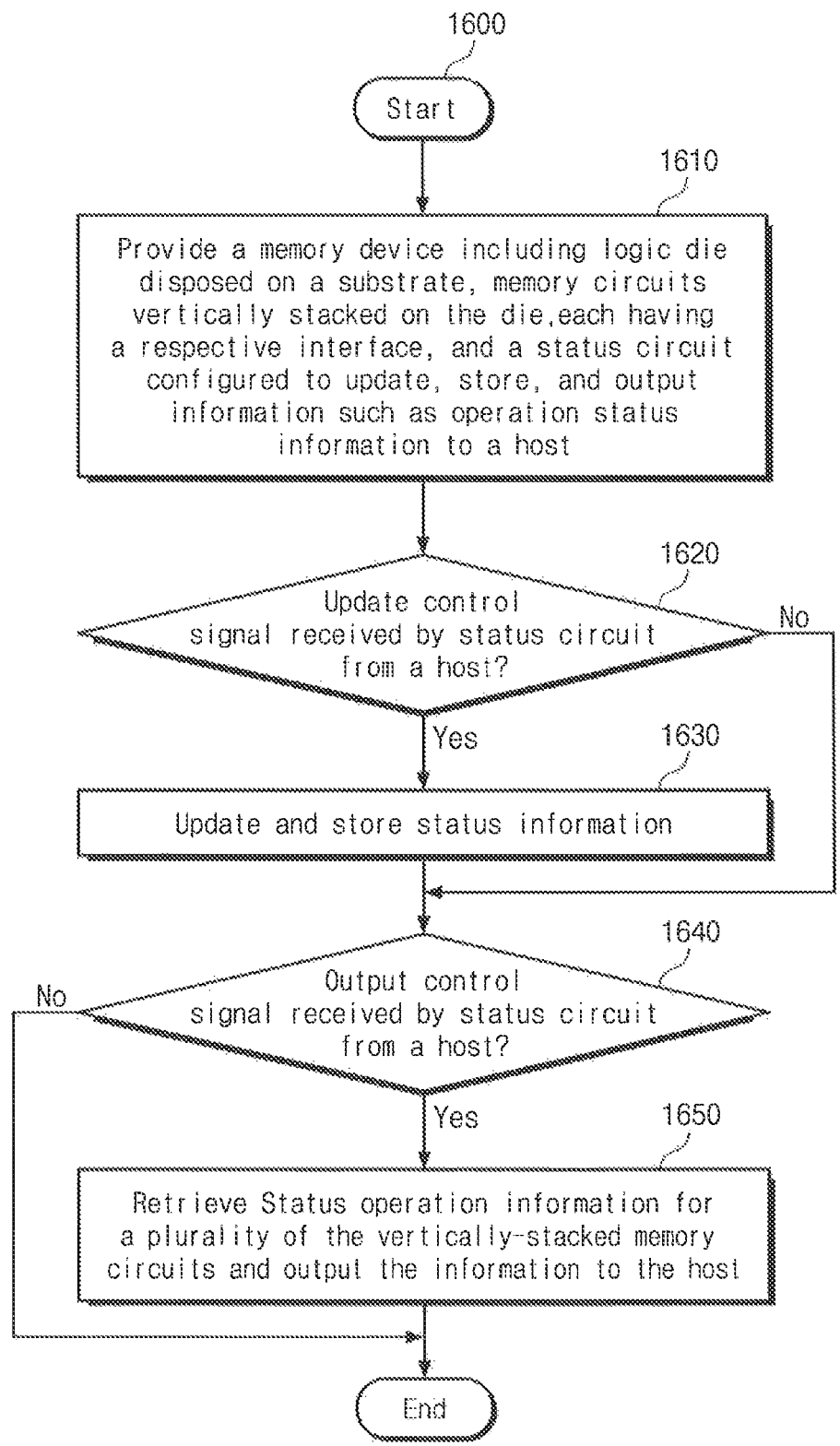
FIGS. 16A and 16B are flowcharts that illustrate operation of a memory device according to the inventive concept.
Figure 16B:
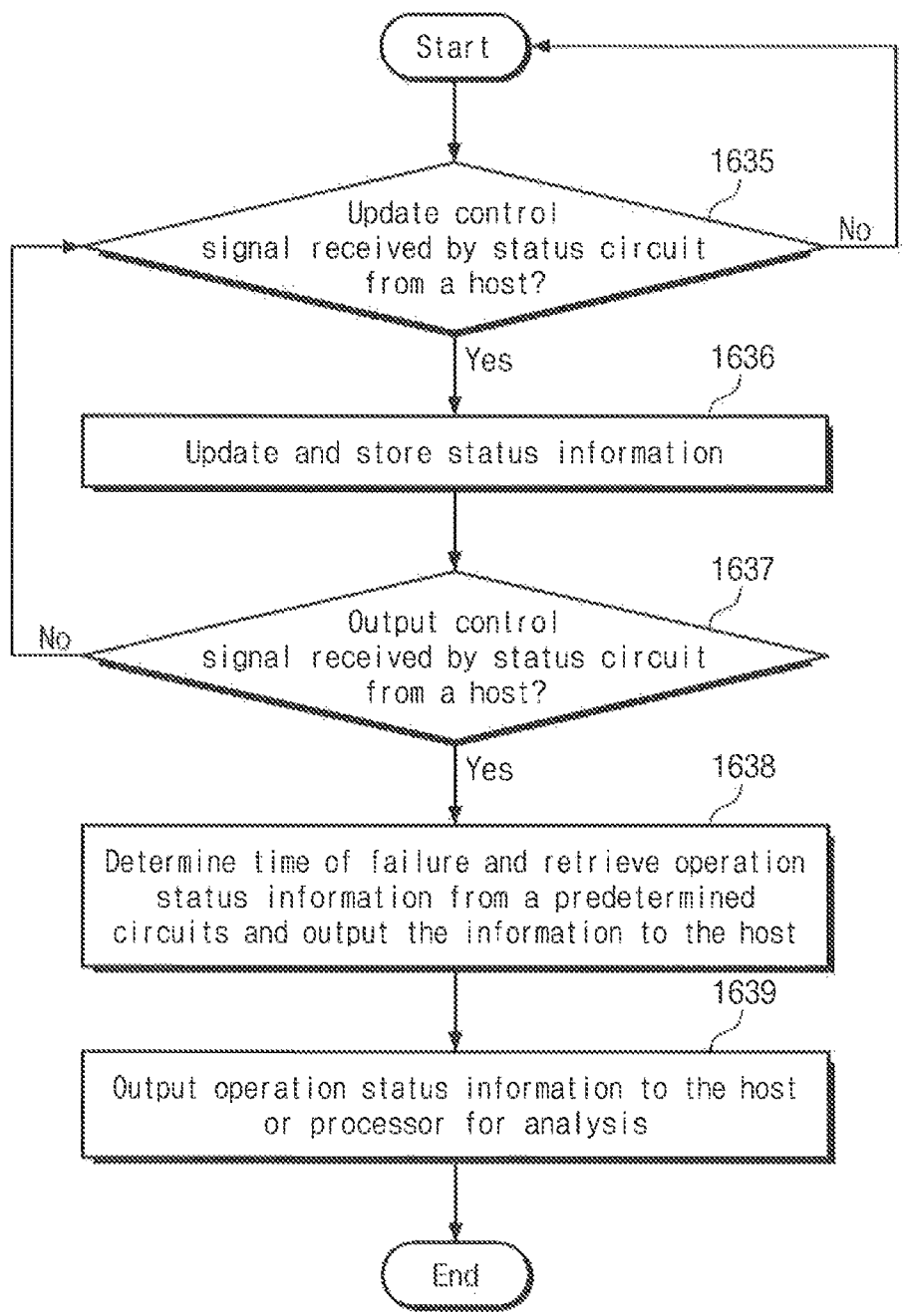

FIGS. 16A and 16B are flowcharts that illustrate the operation of a memory device according to an embodiment of the inventive concept. FIG. 16A is a general overview of the operation of a memory device receiving control signals from a host or processor, and FIG. 16B is directed to an operation failure.

Referring now to FIG. 16A, at 1600 the operations begin. At 1610, a memory device is provided that includes a logic die (e.g. logic circuit) disposed on a substrate, and a plurality of memory circuits vertically stacked on the logic die. It should be understood and appreciated by a person of ordinary skill in the art that the term "memory circuit" may include the structure of a memory device, for example, a memory device having vertically-stacked memory circuits that are connected for communication via TSVs.

In addition, a status circuit is provided, that may be included with the logic die or separately arranged on the substrate. The status circuit is configured to operate in response to receiving control signals. For example an update control signal or an output control signal. The status circuit may be comprised of gates configured for operation, and is part of an integrated circuit.

At operation 1620, it is determined whether an update control signal has been received from a host (or a processor from one or more processors). If the update control signal has been received, the status circuit will update and store operation status information, for example, a command, an address, and input/output data that corresponds to an operation of the plurality of memory devices.

At operation 1630, when the determination at operation 1620 is affirmative, the status circuit updates and stores the operation status information. If the determination at operation 1620 is negative, the status circuit is not updated and continues to store the information from the last update.

At operation 1640, it is determined whether an output control signal is received by a host or processor. When it is determined that the output control signal is received, in response, at operation 1650 the status circuit outputs the operation status information to the host or processor. According to the inventive concept, the information regarding multiple memory devices may be provided to the host with a single output control signal. The operation in FIG. 16A would end at this point pending the receipt of further control signals from the host or processor.

If it is determined at operation 1640 that an output control signal is not received, the operation in FIG. 16A also would end at this point pending the receipt of further control signals from the host or processor.

FIG. 16B is a flowchart illustrating further operation of a memory device according to the inventive concept. FIG. 16B illustrates that there may be periodic or random updates of the operation status information, and the actions that occur in the event that an operation failure is detected.

Referring to FIG. 16B, the operation for detection of an operation begins. At operation 1635, according to this embodiment of the inventive concept, if a periodic or random time has passed, the status circuit may update and store status information of the memory devices (memory circuits). The host may send a control signal to the memory device with the time being monitored at the host. On the other hand, the memory device itself may include a processor or controller that is configured to do an automatic update without a control signal being provided by the host or processor.

In addition to the random or periodic update, at operation 1637, if the host detects an operation failure (such as by the ways disclosed at least in the examples herein above), the host will signal the status circuit to provide operation status information.

At operation 1638, if an operation failure is detected, this information may include operation status from a predetermined time period prior to the operation failure. By providing this additional information, according to the inventive concept, a more exact and faster error analysis may result. The time of failure may be based on, for example, the time that the host initially recognized a reference voltage may have been below a threshold value. In addition, the status circuit may have a relatively small storage area and thus, a dump of the storage at the time the host recognizes a failure may include a certain time prior to the operation failure.

At operation 1639, the control circuit may output the operation status information to the host or processor for analysis.

According to an embodiment of the inventive concept, a memory device including a status circuit and an operating method thereof may provide operation information of the memory device when an operation failure occurs. According to the inventive concept, various data may be provided upon analyzing an operation failure of the memory device. More effective failure analyze and test operations may be performed on the memory device and accuracy of analysis may increase.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory device comprising:
   a command decoder configured to decode a command; and
   a status circuit configured to store operation information of the memory device determined based on the decoded command and to output at least one of the stored operation information in response to an output control signal, and
   wherein an operating environment of the memory device is reset in a time after the at least one of the stored operation information is output, and the operation information is retained in the status circuit during the time.

2. The memory device of claim 1, wherein the operation information is sequentially stored in the status circuit.

3. The memory device of claim 2, wherein the status circuit includes:
   a shift register configured to store sequentially update and store the operation information in response to an update control signal being received, and to output the operation information in response to the output control signal being received.

4. The memory device of claim 1, wherein the status circuit is reset when the memory device is powered up.

5. The memory device of claim 1, wherein the status circuit periodically updates the stored operation information in response to an update control signal being provided from a host.

6. The memory device of claim 5, wherein the update control signal includes a clock signal provided from the host.

7. The memory device of claim 1, wherein the status circuit updates the operation information when a command is provided from a host.

8. The memory device of claim 1, wherein the output control signal is provided from a host through a status information interface.

9. The memory device of claim 8, wherein the operation information is provided to the host through the status information interface.

10. The memory device of claim 1, further comprising:
    a voltage generator configured to generate voltages for driving the memory device.

11. The memory device of claim 10, wherein the voltage generator generates the output control signal when at least one of the generated voltages is lower than a reference voltage.

12. The memory device of claim 1, wherein the output control signal is provided from an external host when the external host compares output data of the memory device with expected data and detects an operation failure of the memory device.

13. The memory device of claim 1, wherein the operation information includes at least one of the decoded command, an address and data provided from a host, and data to be output to the host.

14. The memory device of claim 1, further comprising:
    an input/output driver configured to exchange data with a host,
    wherein the operation information is provided to the host through the input/output driver.

15. The memory device of claim 1, wherein the status circuit operates when the memory device is tested.

16. An operating method of a memory device, the method comprising:
    sequentially storing, by a status circuit included in the memory device, operation information of the memory device which is determined based on a command received from an external host, wherein the operation information includes information provided in the command;
    receiving, by the status circuit, an output control signal; and
    providing, by the status circuit, the operation information, which are sequentially stored, to the external host in response to receiving the output control signal; and
    resetting an operating environment of the memory device after the operation information is provided to the external host, and
    wherein the operation information is retained in the status circuit in a time when the operating environment is reset.

17. The method of claim 16, wherein the receiving the output control signal includes:
    receiving, by the status circuit, the output control signal generated by a voltage generator in response to determining that a voltage generated by the voltage generator included in the memory device is lower than a reference voltage.

18. The method of claim 16, further comprising activating the status circuit for operation when the memory device is tested.

19. A memory device comprising:
    a command decoder configured to decode a command; and
    a status circuit configured to store operation information of the memory device determined based on the decoded command in a first time and to output the stored operation information in response to an output control signal in a second time, and
    wherein an operating environment of the memory device is reset in a third time between the first time and the second time, and the operation information is retained in the status circuit during the third time.

* * * * *